(12) United States Patent
Forrest et al.

(10) Patent No.: US 7,724,796 B2
(45) Date of Patent: May 25, 2010

(54) ORGANIC LASER

(75) Inventors: Stephen Forrest, Ann Arbor, MI (US); Noel Giebink, Ann Arbor, MI (US)

(73) Assignee: The Trustees of Princeton University, Princeton, NJ (US)

( * ) Notice: Subject to any disclaimer, the term of this patent is extended or adjusted under 35 U.S.C. 154(b) by 762 days.

(21) Appl. No.: 11/511,356

(22) Filed: Aug. 29, 2006

(65) Prior Publication Data

US 2008/0067530 A1    Mar. 20, 2008

(51) Int. Cl.
| | |
|---|---|
| H01S 5/00 | (2006.01) |
| H01S 3/00 | (2006.01) |
| H01S 3/09 | (2006.01) |
| H01S 3/091 | (2006.01) |
| H01L 27/15 | (2006.01) |
| H01L 35/24 | (2006.01) |

(52) U.S. Cl. .......... 372/46.01; 372/38.06; 372/69; 372/70; 257/40; 257/79

(58) Field of Classification Search .......... 372/38.06, 372/46.01, 69, 70; 257/79, 40
See application file for complete search history.

(56) References Cited

U.S. PATENT DOCUMENTS

| | | | |
|---|---|---|---|
| 4,769,292 A | 9/1988 | Tang et al. | |
| 5,703,436 A | 12/1997 | Forrest et al. | |
| 5,707,745 A | 1/1998 | Forrest et al. | |
| 5,834,893 A | 11/1998 | Bulovic et al. | |
| 5,844,363 A | 12/1998 | Gu et al. | |
| 6,013,982 A | 1/2000 | Thompson et al. | |
| 6,087,196 A | 7/2000 | Sturm et al. | |
| 6,091,195 A | 7/2000 | Forrest et al. | |
| 6,111,902 A | 8/2000 | Kozlov | |
| 6,160,828 A * | 12/2000 | Kozlov et al. ............... | 372/39 |
| 6,294,398 B1 | 9/2001 | Kim et al. | |
| 6,303,238 B1 | 10/2001 | Thompson et al. | |
| 6,310,360 B1 | 10/2001 | Forrest et al. | |
| 6,330,262 B1 | 12/2001 | Burrows | |
| 6,337,102 B1 | 1/2002 | Forrest et al. | |
| 6,396,860 B1 * | 5/2002 | Kozlov et al. ............... | 372/39 |
| 6,468,819 B1 | 10/2002 | Kim et al. | |
| 6,548,956 B2 | 4/2003 | Forrest et al. | |

(Continued)

FOREIGN PATENT DOCUMENTS

EP    1 411 606    4/2004

(Continued)

OTHER PUBLICATIONS

U.S. Appl. No. 09/931,948, filed Aug. 20, 2001, Lu et al.

(Continued)

*Primary Examiner*—Minsun Harvey
*Assistant Examiner*—Phillip Nguyen
(74) *Attorney, Agent, or Firm*—Kenyon & Kenyon LLP

(57) ABSTRACT

A device comprising an organic light emitting layer may be optically pumped to create excited states within the layer. When an electric field is applied across the layer, the excited states may dissociate into geminate polaron pairs within the organic layer. The dissociated states may change back to excitons when the electric field is rapidly reduced or removed. The organic light emitting layer may be optically pumped by an adjacent OLED, allowing for an electrically-driven device.

10 Claims, 22 Drawing Sheets

U.S. PATENT DOCUMENTS

| | | | |
|---|---|---|---|
| 6,576,134 | B1 | 6/2003 | Agner |
| 6,602,540 | B2 | 8/2003 | Gu et al. |
| 6,687,266 | B1 * | 2/2004 | Ma et al. ............... 372/7 |
| 6,824,891 | B2 * | 11/2004 | Okada et al. ............. 428/690 |
| 6,879,618 | B2 * | 4/2005 | Cok et al. ............... 372/70 |
| 6,916,554 | B2 * | 7/2005 | Ma et al. ................ 428/690 |
| 2002/0034656 | A1 | 3/2002 | Thompson et al. |
| 2002/0118710 | A1 * | 8/2002 | Kopp et al. ............. 372/7 |
| 2002/0182441 | A1 | 12/2002 | Lamansky et al. |
| 2003/0072964 | A1 | 4/2003 | Kwong et al. |
| 2003/0230980 | A1 | 12/2003 | Forrest et al. |
| 2004/0239892 | A1 * | 12/2004 | Cok et al. ............... 353/94 |
| 2005/0062903 | A1 | 3/2005 | Cok et al. |
| 2006/0234084 | A1 * | 10/2006 | Cosimbescu et al. ........ 428/690 |
| 2008/0018232 | A1 * | 1/2008 | Zhang et al. ............. 313/498 |
| 2009/0021161 | A1 * | 1/2009 | Lee et al. ............... 313/506 |
| 2009/0278445 | A1 * | 11/2009 | Jen et al. ............... 313/504 |

FOREIGN PATENT DOCUMENTS

WO    WO 02/074015    9/2002

OTHER PUBLICATIONS

U.S. Appl. No. 10/233,470, filed Sep. 4, 2002, Shtein et al.

Adachi et al., "Nearly 100% Internal Phosphorescent Efficiency In An Organic Light Emitting Device," J. Appl. Phys. 90:5048, 2001.

Baldo et al., "Highly Efficient Phosphorescent Emission from Organic Electroluminescent Devices", Nature 395:151-154, 1998.

Baldo et al., "Very high efficiency green organic light-emitting devices based on electrophosphorescence," Appl. Phys.Lett. 75(3):4-6, 1999.

Schweitzer et al., 1999, "Field induced delayed photoluminescence in a conjugated polymer", Chemical Physics Lett 304:365-70.

Reufer et al., 2005, "Spin Conserving carrier recombination in conjugated polymers", Nature Materials 4:340-346.

Kozlov et al., 2000, "Structures for Organic Diode Lasers and Optical Properties of Organic Semiconductors Under Intense Optical and Electrical Excitations", IEEE Journal of Quantum Electronics, IEEE Service Center,Piscataway, New Jersey. 36(1):18-26.

Reufer et al., 2005, "Spin-Conserving carrier recombination in conjugated polymers". Nat. Mater.; 4(4):340-346.

Lane et al., 2004, "Electromodulation studies of a polyfluorene light-emitting diodes", Proc. Of the SPIE-International Society for Optical Engineering SPIE-INT. Soc. Opt. Eng. USA, 5519(1):100-109.

Ming et al., 2003, "Mutual enhancement of cathodoluminescence and organic electroluminescence in SiO2/C0-PPV heterogeneous junction". Acta Physica Sinica Chinese Phys. Soc. China 52(4):1013-1018.

Pinner et al., 2000, "Analysis of the turn-off dynamics in polymer light-emitting diodes" Appl. Phys. Lett. American Institute of Physics, Melville, NY. 76(9):1137-1139.

Schewitzer et al., 1999, "Field Induced delayed photoluminescence in a conjugated polymer", Chemical Physics Letters Elsevier Netherlands, 304(5-6):365-370.

Rothe et al., 2005, "Electric-field-induced singlet and triplet exciton quenching in films of the conjugted polymer polyspirobifluorene", Physical Review B APS Through AIP USA 72(8):852201-852207.

Giebink et al., 2006, "Accumulation of electric-field-stbilized geminate polaron pairs in an organic semiconductor to attain high excitation density under low intensity pumping", Appl. Phys. Lett., American Institute of Physics, Melville, NY. 89(19):193502-.

Giebink et al., 2007, "Limits to accumulation of electric-field stabilized geminate polaron pairs in an organic semiconductor thin film", Physical Review B., American Physical Society 76:753181-753187.

International Search Report and Written Opinion from PCT/US2007/016773, mailed on Mar. 19, 2008.

* cited by examiner

ORGANIC LASER

GOVERNMENT RIGHTS

This invention was made with U.S. Government support under Contract No. FA9550-01-0120 awarded by the Air Force Office of Science Research. The government has certain rights in this invention.

The claimed inventions were made by, on behalf of, and/or in connection with one or more of the following parties to a joint university-corporation research agreement: Princeton University, The University of Southern California, The University of Michigan, and the Universal Display Corporation. The agreement was in effect on or before the date the claimed inventions were made, and the claimed inventions were made as a result of activities undertaken within the scope of the agreement.

FIELD OF THE INVENTION

The present invention relates to organic light emitting devices (OLEDs), and more specifically to organic light emitting devices using electro-optical pumping.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules. In general, a small molecule has a well-defined chemical formula with a single molecular weight, whereas a polymer has a chemical formula and a molecular weight that may vary from molecule to molecule. As used herein, "organic" includes metal complexes of hydrocarbyl and heteroatom-substituted hydrocarbyl ligands.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

OLED devices are generally (but not always) intended to emit light through at least one of the electrodes, and one or more transparent electrodes may be useful in an organic opto-electronic devices. For example, a transparent electrode material, such as indium tin oxide (ITO), may be used as the bottom electrode. A transparent top electrode, such as disclosed in U.S. Pat. Nos. 5,703,436 and 5,707,745, which are incorporated by reference in their entireties, may also be used. For a device intended to emit light only through the bottom electrode, the top electrode does not need to be transparent, and may be comprised of a thick and reflective metal layer having a high electrical conductivity. Similarly, for a device intended to emit light only through the top electrode, the bottom electrode may be opaque and/or reflective. Where an electrode does not need to be transparent, using a thicker layer may provide better conductivity, and using a reflective electrode may increase the amount of light emitted through the other electrode, by reflecting light back towards the transparent electrode. Fully transparent devices may also be fabricated, where both electrodes are transparent. Side emitting OLEDs may also be fabricated, and one or both electrodes may be opaque or reflective in such devices.

As used herein, "top" means furthest away from the substrate, while "bottom" means closest to the substrate. For example, for a device having two electrodes, the bottom electrode is the electrode closest to the substrate, and is generally the first electrode fabricated. The bottom electrode has two surfaces, a bottom surface closest to the substrate, and a top surface further away from the substrate. Where a first layer is described as "disposed over" a second layer, the first layer is disposed further away from substrate. There may be other layers between the first and second layer, unless it is specified that the first layer is "in physical contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

SUMMARY OF THE INVENTION

A device comprising an organic light emitting layer may be optically pumped to create excited states within the layer. When an electric field is applied across the layer, the excited states may dissociate into geminate polaron pairs within the organic layer. The dissociated states may change back to excitons when the electric field is rapidly reduced or removed. The organic light emitting layer may be optically pumped by an adjacent OLED, allowing for an electrically-driven device.

DETAILED DESCRIPTION

Figure 1:
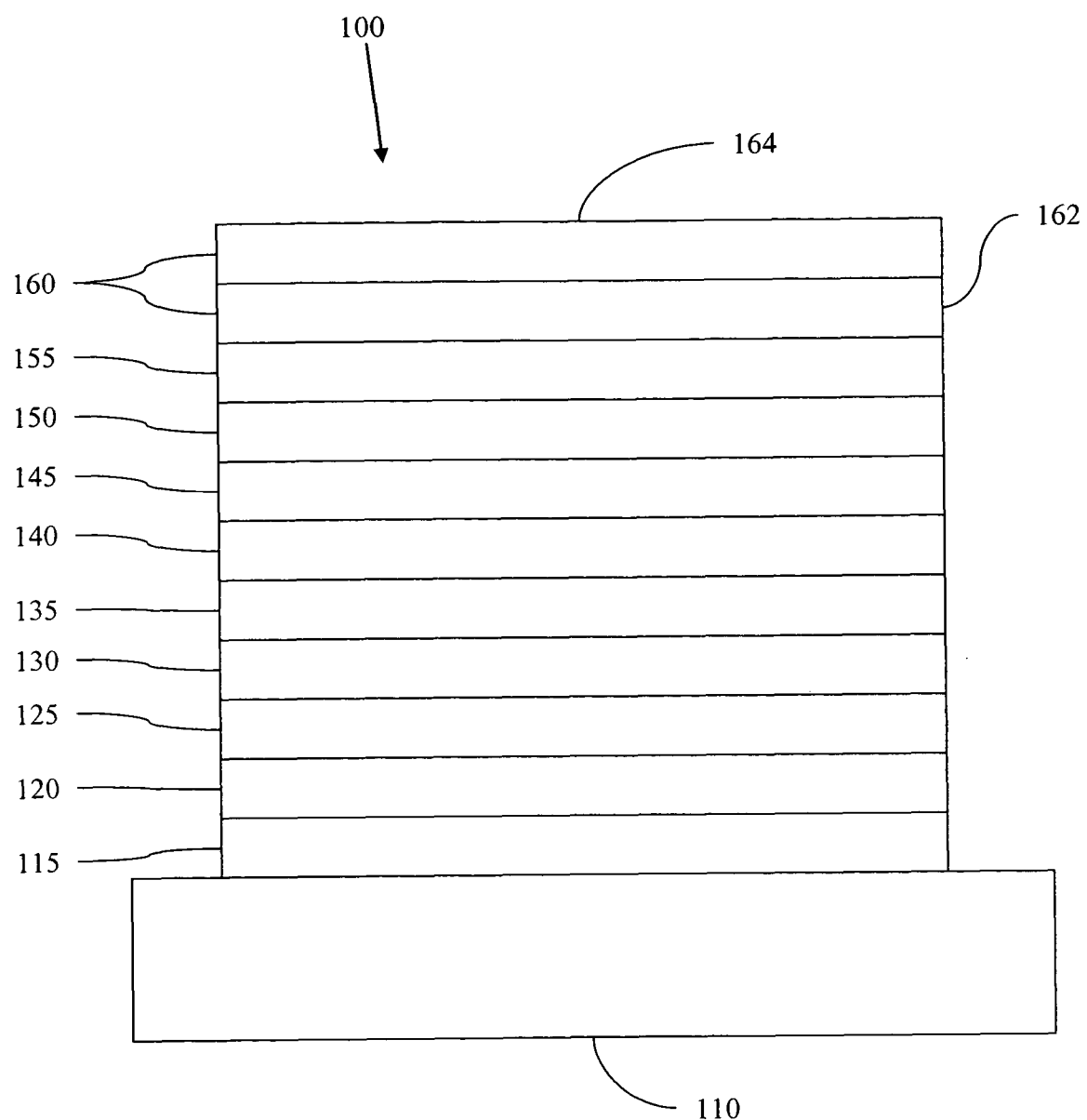
FIG. 1 shows an organic light emitting device having separate electron transport, hole transport, and emissive layers, as well as other layers.

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 1, 4-6 (1999) ("Baldo-II"), which are incorporated by reference in their entireties. Phosphorescence may be referred to as a "forbidden" transition because the transition requires a change in spin states, and quantum mechanics indicates that such a transition is not favored. As a result, phosphorescence generally occurs in a time frame exceeding at least 10 nanoseconds, and typically greater than 100 nanoseconds. If the natural radiative lifetime of phosphorescence is too long, triplets may decay by a non-radiative mechanism, such that no light is emitted. Organic phosphorescence is also often observed in molecules containing heteroatoms with unshared pairs of electrons at very low temperatures. 2,2'-bipyridine is such a molecule. Non-radiative decay mechanisms are typically temperature dependent, such that an organic material that exhibits phosphorescence at liquid nitrogen temperatures typically does not exhibit phosphorescence at room temperature. But, as demonstrated by Baldo, this problem may be addressed by selecting phosphorescent compounds that do phosphoresce at room temperature. Representative emissive layers include doped or un-doped phosphorescent organometallic materials such as disclosed in U.S. Pat. Nos. 6,303,238 and 6,310,360; U.S. Patent Application Publication Nos. 2002-0034656; 2002-0182441; 2003-0072964; and WO-02/074015.

Generally, the excitons in an OLED are believed to be created in a ratio of about 3:1, i.e., approximately 75% triplets and 25% singlets. See, Adachi et al., "Nearly 100% Internal Phosphorescent Efficiency In An Organic Light Emitting Device," J. Appl. Phys., 90, 5048 (2001), which is incorporated by reference in its entirety. In many cases, singlet excitons may readily transfer their energy to triplet excited states via "intersystem crossing," whereas triplet excitons may not readily transfer their energy to singlet excited states. As a result, 100% internal quantum efficiency is theoretically possible with phosphorescent OLEDs. In a fluorescent device, the energy of triplet excitons is generally lost to radiationless decay processes that heat-up the device, resulting in much lower internal quantum efficiencies. OLEDs utilizing phosphorescent materials that emit from triplet excited states are disclosed, for example, in U.S. Pat. No. 6,303,238, which is incorporated by reference in its entirety.

Phosphorescence may be preceded by a transition from a triplet excited state to an intermediate non-triplet state from which the emissive decay occurs. For example, organic molecules coordinated to lanthanide elements often phosphoresce from excited states localized on the lanthanide metal. However, such materials do not phosphoresce directly from a triplet excited state but instead emit from an atomic excited state centered on the lanthanide metal ion. The europium diketonate complexes illustrate one group of these types of species.

Phosphorescence from triplets can be enhanced over fluorescence by confining, preferably through bonding, the organic molecule in close proximity to an atom of high atomic number. This phenomenon, called the heavy atom effect, is created by a mechanism known as spin-orbit coupling. Such a phosphorescent transition may be observed from an excited metal-to-ligand charge transfer (MLCT) state of an organometallic molecule such as tris(2-phenylpyridine)iridium(III).

As used herein, the term "triplet energy" refers to an energy corresponding to the highest energy feature discernable in the phosphorescence spectrum of a given material. The highest energy feature is not necessarily the peak having the greatest intensity in the phosphorescence spectrum, and could, for example, be a local maximum of a clear shoulder on the high energy side of such a peak.

The term "organometallic" as used herein is as generally understood by one of ordinary skill in the art and as given, for example, in "Inorganic Chemistry" (2nd Edition) by Gary L. Miessler and Donald A. Tarr, Prentice Hall (1998). Thus, the term organometallic refers to compounds which have an organic group bonded to a metal through a carbon-metal bond. This class does not include per se coordination compounds, which are substances having only donor bonds from heteroatoms, such as metal complexes of amines, halides, pseudohalides (CN, etc.), and the like. In practice organometallic compounds generally comprise, in addition to one or more carbon-metal bonds to an organic species, one or more donor bonds from a heteroatom. The carbon-metal bond to an organic species refers to a direct bond between a metal and a carbon atom of an organic group, such as phenyl, alkyl, alkenyl, etc., but does not refer to a metal bond to an "inorganic carbon," such as the carbon of CN or CO.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, and a cathode 160. Cathode 160 is a compound cathode having a first conductive layer 162 and a second conductive layer 164. Device 100 may be fabricated by depositing the layers described, in order.

Substrate 110 may be any suitable substrate that provides desired structural properties. Substrate 110 may be flexible or rigid. Substrate 110 may be transparent, translucent or opaque. Plastic and glass are examples of preferred rigid substrate materials. Plastic and metal foils are examples of preferred flexible substrate materials. Substrate 110 may be a semiconductor material in order to facilitate the fabrication of circuitry. For example, substrate 110 may be a silicon wafer upon which circuits are fabricated, capable of controlling OLEDs subsequently deposited on the substrate. Other substrates may be used. The material and thickness of substrate 110 may be chosen to obtain desired structural and optical properties.

Anode 115 may be any suitable anode that is sufficiently conductive to transport holes to the organic layers. The material of anode 115 preferably has a work function higher than about 4 eV (a "high work function material"). Preferred anode materials include conductive metal oxides, such as indium tin oxide (ITO) and indium zinc oxide (IZO), aluminum zinc oxide (AlZnO), and metals. Anode 115 (and substrate 110) may be sufficiently transparent to create a bottom-emitting device. A preferred transparent substrate and anode combination is commercially available ITO (anode) deposited on glass or plastic (substrate). A flexible and transparent substrate-anode combination is disclosed in U.S. Pat. Nos. 5,844,363 and 6,602,540 B2, which are incorporated by reference in their entireties. Anode 115 may be opaque and/or reflective. A reflective anode 115 may be preferred for some top-emitting devices, to increase the amount of light emitted from the top of the device. The material and thickness of anode 115 may be chosen to obtain desired conductive and optical properties. Where anode 115 is transparent, there may be a range of thickness for a particular material that is thick enough to provide the desired conductivity, yet thin enough to provide the desired degree of transparency. Other anode materials and structures may be used.

Hole transport layer 125 may include a material capable of transporting holes. Hole transport layer 130 may be intrinsic (undoped), or doped. Doping may be used to enhance conductivity. α-NPD and TPD are examples of intrinsic hole transport layers. An example of a p-doped hole transport layer is m-MTDATA doped with $F_4$-TCNQ at a molar ratio of 50:1, as disclosed in United States Patent Application Publication No. 2003-0230980 to Forrest et al., which is incorporated by reference in its entirety. Other hole transport layers may be used.

Emissive layer 135 may include an organic material capable of emitting light when a current is passed between anode 115 and cathode 160. Preferably, emissive layer 135 contains a phosphorescent emissive material, although fluorescent emissive materials may also be used. Phosphorescent materials are preferred because of the higher luminescent efficiencies associated with such materials. Emissive layer 135 may also comprise a host material capable of transporting electrons and/or holes, doped with an emissive material that may trap electrons, holes, and/or excitons, such that excitons relax from the emissive material via a photoemissive mechanism. Emissive layer 135 may comprise a single material that combines transport and emissive properties. Whether the emissive material is a dopant or a major constituent, emissive layer 135 may comprise other materials, such as dopants that tune the emission of the emissive material. Emissive layer 135 may include a plurality of emissive materials capable of, in combination, emitting a desired spectrum of light. Examples of phosphorescent emissive materials include Ir(ppy)$_3$. Examples of fluorescent emissive materials include DCM and DMQA. Examples of host materials include Alq$_3$, CBP and mCP. Examples of emissive and host materials are disclosed in U.S. Pat. No. 6,303,238 to Thompson et al., which is incorporated by reference in its entirety. Emissive material may be included in emissive layer 135 in a number of ways. For example, an emissive small molecule may be incorporated into a polymer. This may be accomplished by several ways: by doping the small molecule into the polymer either as a separate and distinct molecular species; or by incorporating the small molecule into the backbone of the polymer, so as to form a co-polymer; or by bonding the small molecule as a pendant group on the polymer. Other emissive layer materials and structures may be used. For example, a small molecule emissive material may be present as the core of a dendrimer.

Many useful emissive materials include one or more ligands bound to a metal center. A ligand may be referred to as "photoactive" if it contributes directly to the photoactive properties of an organometallic emissive material. A "photoactive" ligand may provide, in conjunction with a metal, the energy levels from which and to which an electron moves when a photon is emitted. Other ligands may be referred to as "ancillary." Ancillary ligands may modify the photoactive properties of the molecule, for example by shifting the energy levels of a photoactive ligand, but ancillary ligands do not directly provide the energy levels involved in light emission. A ligand that is photoactive in one molecule may be ancillary in another. These definitions of photoactive and ancillary are intended as non-limiting theories.

Electron transport layer 145 may include a material capable of transporting electrons. Electron transport layer 145 may be intrinsic (undoped), or doped. Doping may be used to enhance conductivity. Alq$_3$ is an example of an intrinsic electron transport layer. An example of an n-doped electron transport layer is BPhen doped with Li at a molar ratio of 1:1, as disclosed in United States Patent Application Publication No. 2003-02309890 to Forrest et al., which is incorporated by reference in its entirety. Other electron transport layers may be used.

The charge carrying component of the electron transport layer may be selected such that electrons can be efficiently injected from the cathode into the LUMO (Lowest Unoccupied Molecular Orbital) energy level of the electron transport layer. The "charge carrying component" is the material responsible for the LUMO energy level that actually transports electrons. This component may be the base material, or it may be a dopant. The LUMO energy level of an organic material may be generally characterized by the electron affinity of that material and the relative electron injection efficiency of a cathode may be generally characterized in terms of the work function of the cathode material. This means that the preferred properties of an electron transport layer and the adjacent cathode may be specified in terms of the electron affinity of the charge carrying component of the ETL and the work function of the cathode material. In particular, so as to achieve high electron injection efficiency, the work function of the cathode material is preferably not greater than the electron affinity of the charge carrying component of the electron transport layer by more than about 0.75 eV, more preferably, by not more than about 0.5 eV. Similar considerations apply to any layer into which electrons are being injected.

Cathode 160 may be any suitable material or combination of materials known to the art, such that cathode 160 is capable of conducting electrons and injecting them into the organic layers of device 100. Cathode 160 may be transparent or opaque, and may be reflective. Metals and metal oxides are examples of suitable cathode materials. Cathode 160 may be a single layer, or may have a compound structure. FIG. 1 shows a compound cathode 160 having a thin metal layer 162 and a thicker conductive metal oxide layer 164. In a compound cathode, preferred materials for the thicker layer 164 include ITO, IZO, and other materials known to the art. U.S. Pat. Nos. 5,703,436, 5,707,745, 6,548,956 B2 and 6,576,134 B2, which are incorporated by reference in their entireties, disclose examples of cathodes including compound cathodes having a thin layer of metal such as Mg:Ag with an overlying transparent, electrically-conductive, sputter-deposited ITO layer. The part of cathode 160 that is in contact with the underlying organic layer, whether it is a single layer cathode 160, the thin metal layer 162 of a compound cathode, or some other part, is preferably made of a material having a work function lower than about 4 eV (a "low work function material"). Other cathode materials and structures may be used.

Blocking layers may be used to reduce the number of charge carriers (electrons or holes) and/or excitons that leave the emissive layer. An electron blocking layer 130 may be disposed between emissive layer 135 and the hole transport layer 125, to block electrons from leaving emissive layer 135 in the direction of hole transport layer 125. Similarly, a hole blocking layer 140 may be disposed between emissive layer 135 and electron transport layer 145, to block holes from leaving emissive layer 135 in the direction of electron transport layer 145. Blocking layers may also be used to block excitons from diffusing out of the emissive layer. The theory and use of blocking layers is described in more detail in U.S. Pat. No. 6,097,147 and United States Patent Application Publication No. 2003-02309890 to Forrest et al., which are incorporated by reference in their entireties.

As used herein, and as would be understood by one skilled in the art, the term "blocking layer" means that the layer provides a barrier that significantly inhibits transport of charge carriers and/or excitons through the device, without suggesting that the layer necessarily completely blocks the charge carriers and/or excitons. The presence of such a blocking layer in a device may result in substantially higher efficiencies as compared to a similar device lacking a blocking layer. Also, a blocking layer may be used to confine emission to a desired region of an OLED.

Generally, injection layers are comprised of a material that may improve the injection of charge carriers from one layer, such as an electrode or an organic layer, into an adjacent organic layer. Injection layers may also perform a charge transport function. In device 100, hole injection layer 120 may be any layer that improves the injection of holes from anode 115 into hole transport layer 125. CuPc is an example of a material that may be used as a hole injection layer from an ITO anode 115, and other anodes. In device 100, electron injection layer 150 may be any layer that improves the injection of electrons into electron transport layer 145. LiF/Al is an example of a material that may be used as an electron injection layer into an electron transport layer from an adjacent layer. Other materials or combinations of materials may be used for injection layers. Depending upon the configuration of a particular device, injection layers may be disposed at locations different than those shown in device 100. More examples of injection layers are provided in U.S. patent application Ser. No. 09/931,948 to Lu et al., which is incorporated by reference in its entirety. A hole injection layer may comprise a solution deposited material, such as a spin-coated polymer, e.g., PEDOT:PSS, or it may be a vapor deposited small molecule material, e.g., CuPc or MTDATA.

A hole injection layer (HIL) may planarize or wet the anode surface so as to provide efficient hole injection from the anode into the hole injecting material. A hole injection layer may also have a charge carrying component having HOMO (Highest Occupied Molecular Orbital) energy levels that favorably match up, as defined by their herein-described relative ionization potential (IP) energies, with the adjacent anode layer on one side of the HIL and the hole transporting layer on the opposite side of the HIL. The "charge carrying component" is the material responsible for the HOMO energy level that actually transports holes. This component may be the base material of the HIL, or it may be a dopant. Using a doped HIL allows the dopant to be selected for its electrical properties, and the host to be selected for morphological properties such as wetting, flexibility, toughness, etc. Preferred properties for the HIL material are such that holes can be efficiently injected from the anode into the HIL material. In particular, the charge carrying component of the HIL preferably has an IP not more than about 0.7 eV greater that the IP of the anode material. More preferably, the charge carrying component has an IP not more than about 0.5 eV greater than the anode material. Similar considerations apply to any layer into which holes are being injected. HIL materials are further distinguished from conventional hole transporting materials that are typically used in the hole transporting layer of an OLED in that such HIL materials may have a hole conductivity that is substantially less than the hole conductivity of conventional hole transporting materials. The thickness of the HIL of the present invention may be thick enough to help planarize or wet the surface of the anode layer. For example, an HIL thickness of as little as 10 nm may be acceptable for a very smooth anode surface. However, since anode surfaces tend to be very rough, a thickness for the HIL of up to 50 nm may be desired in some cases.

A protective layer may be used to protect underlying layers during subsequent fabrication processes. For example, the processes used to fabricate metal or metal oxide top electrodes may damage organic layers, and a protective layer may be used to reduce or eliminate such damage. In device 100, protective layer 155 may reduce damage to underlying organic layers during the fabrication of cathode 160. Preferably, a protective layer has a high carrier mobility for the type of carrier that it transports (electrons in device 100), such that it does not significantly increase the operating voltage of device 100. CuPc, BCP, and various metal phthalocyanines are examples of materials that may be used in protective layers. Other materials or combinations of materials may be used. The thickness of protective layer 155 is preferably thick enough that there is little or no damage to underlying layers due to fabrication processes that occur after organic protective layer 160 is deposited, yet not so thick as to significantly increase the operating voltage of device 100. Protective layer 155 may be doped to increase its conductivity. For example, a CuPc or BCP protective layer 160 may be doped with Li. A more detailed description of protective layers may be found in U.S. patent application Ser. No. 09/931,948 to Lu et al., which is incorporated by reference in its entirety.

Figure 2:
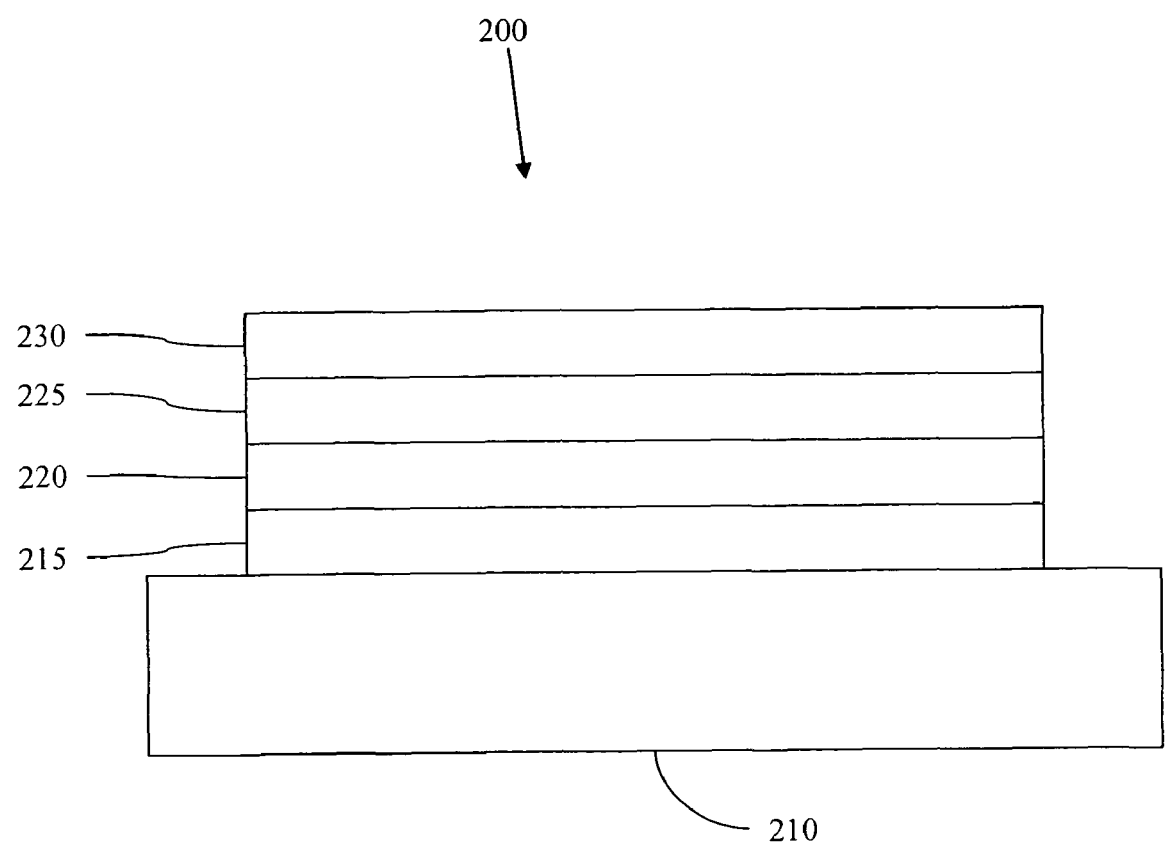
FIG. 2 shows an inverted organic light emitting device that does not have a separate electron transport layer.

FIG. 2 shows an inverted OLED 200. The device includes a substrate 210, an cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190, Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. patent application Ser. No. 10/233,470, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJP. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

The molecules disclosed herein may be substituted in a number of different ways without departing from the scope of the invention. For example, substituents may be added to a compound having three bidentate ligands, such that after the substituents are added, one or more of the bidentate ligands are linked together to form, for example, a tetradentate or hexadentate ligand. Other such linkages may be formed. It is believed that this type of linking may increase stability relative to a similar compound without linking, due to what is generally understood in the art as a "chelating effect."

Devices fabricated in accordance with embodiments of the invention may be incorporated into a wide variety of consumer products, including flat panel displays, computer monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.).

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

The use of an electric field may allow for the "storage" of long-lived, metastable excited states in an organic light emitting layer. An organic layer may be pumped with an optical energy source, such as a laser or an OLED. This pumping may cause excitons to form in the organic laser. In the presence of an electric field applied across the organic layer, the excitons may separate into geminate pair polarons. While the electric field is applied, geminate pair polaron states may accumulate in the organic layer. These state may then convert to exciton states when the electric field is decreased or removed, causing the organic layer to emit a rapid, high-brightness flash of illumination. Since the number of created excited states is proportional to the time over which the organic layer is pumped, metastable polaron pair states may accumulate over time by pumping an organic layer with a linear-rate pump source. It is believed that the number of polaron pair states created is proportional to $t^r$, where t is the time over which the organic layer is pumped. In general r will be less than 1, allowing for an increase in population density regardless of coupling efficiencies:

CreatedStates=$C(t)$=$Kt$

P.P.States=$P.P(t)$=$C(t)At^r$ ⇒ $Bt^r$ where A, B, and K are constants.

Figure 3A:
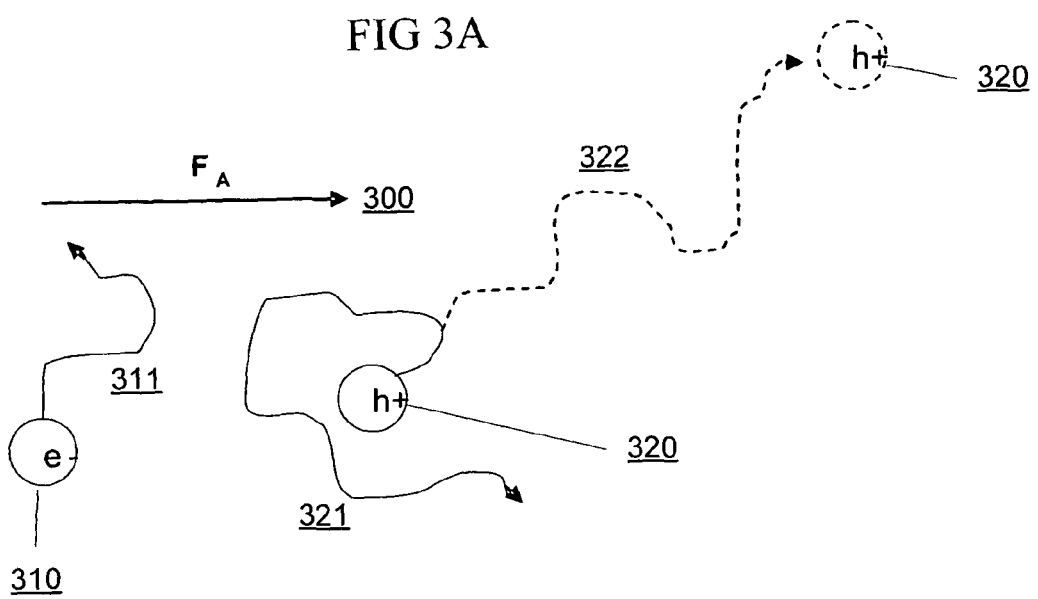
FIG. 3A shows a schematic representation of a dissociated exciton.

FIG. 3A shows a schematic diagram of an exciton in an organic emissive layer with a field $F_A$ applied across the layer. An electron 310 and a hole 320 in an exciton may dissociate in the presence of an electric field 300. For example, in the absence of the electric field 300 the electron and hole may follow the solid paths 311, 321, respectively. When an electric field is applied, the exciton may dissociate into a geminate polaron pair, shown by the dotted path 322.

Figure 3B:
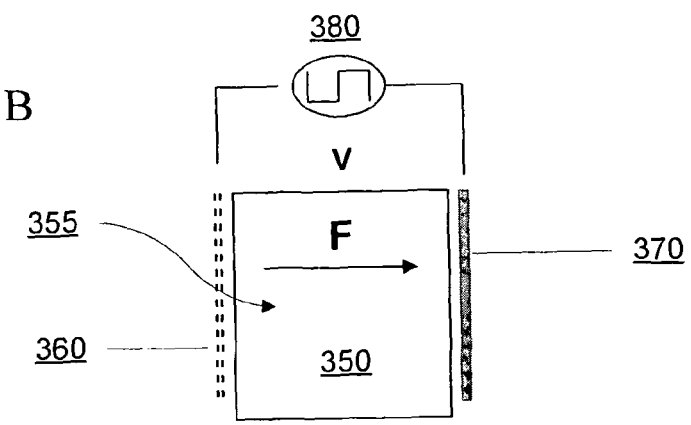
FIG. 3B shows an organic light emitting device having an emissive layer disposed between two electrodes.

FIG. 3B shows a device having an organic light emitting layer 350 disposed between two electrodes 360, 370. The organic layer 350 may be optically pumped with an optical pumping source 355. It may be preferred for the pumping source 355 to be a low intensity and/or continuous source. An electric field may be created across the organic layer by applying a voltage 380 to the electrodes 360, 370. The electric field is then reduced or removed (i.e., reduced to 0), allowing geminate polaron pair states to be converted to exciton states. As used herein, the "holding time" may refer to the amount of time an electric field is applied to a pumped organic emissive layer before being reduced or removed. When the polaron pair states convert to exciton states, a short-duration, high-intensity pulse of light may be emitted by the organic layer 350. It may be preferred for the wavelength of light used to optically pump the organic layer to be shorter than the wavelength of light emitted by the organic layer when the field is changed. A periodic source such as a square-wave voltage may be used to generate the electric field, thus repeatedly applying and reducing/removing the field. If such a source is used to generate the electric field, it may be preferred for the source to have a frequency of about 0.1 to 100 Hz.

Figure 3C:
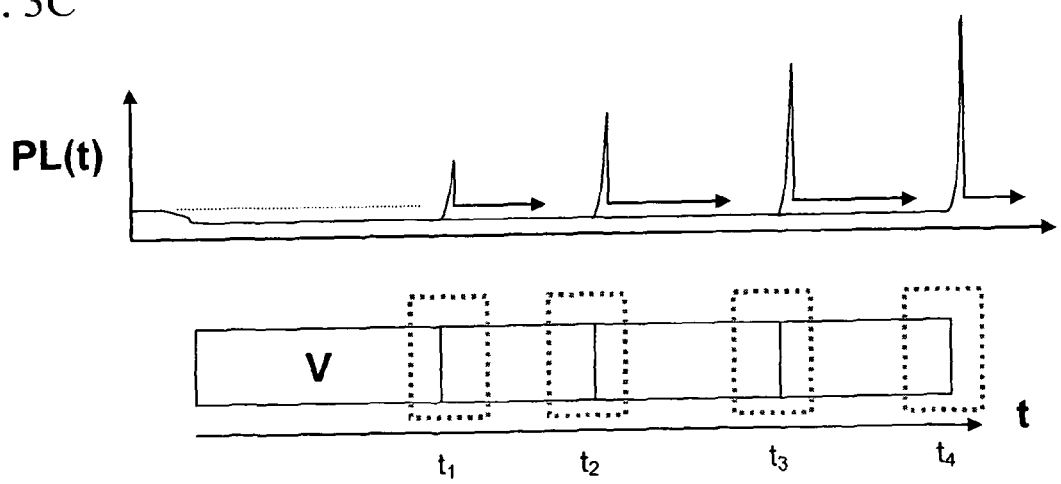
FIG. 3C shows the photoluminescence of a pumped organic layer when an electric field is applied across the layer and removed.

FIG. 3C shows a model of the applied voltage and the photoluminescence of the organic layer 350 for various holding times $t_1$-$t_4$. At longer holding times, the photoluminescence of the organic layer is greater. For example, at a relatively long holding time $t_4$, the photoluminescence of the organic layer is much greater than at a shorter holding time $t_1$.

The dissociation effects described herein have been observed at electric fields of about 0.5 MV/cm to about 3.0 MV/cm, though it is believed that fields as low as about 0.1 MV/cm may be used. At field strengths above about 3.0 MV/cm, many organic emissive materials may break down. It may be preferred to reduce the electric field applied across the organic layer to about 0. It is preferred that the electric field be reduced rapidly, and especially preferred that the electric field be reduced at a rate higher than the rate at which geminate polaron pair states convert to exciton states. It is believed that the geminate pair states convert to exciton states as rapidly or almost as rapidly as the electric field allows. The rate at which the electric field may be changed is limited by the RC time constant of the circuit generating the electric field. Currently, change times of about 10 ns have been achieved, though it is believed that times of about 100 ps-1 ns may be achieved with the use of appropriate scaling technologies and methods. As used herein, an electric field is changed "rapidly" if it is changed over a time period on the order of about 100 ps-10 ns.

Figure 4A:
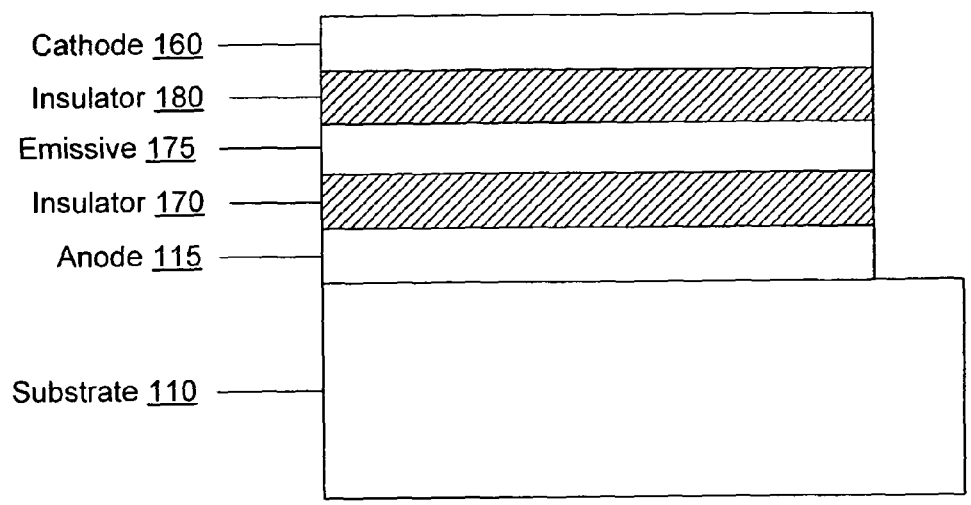
FIG. 4A shows an organic light emitting device having an emissive layer that can be optically pumped.
Figure 4B:
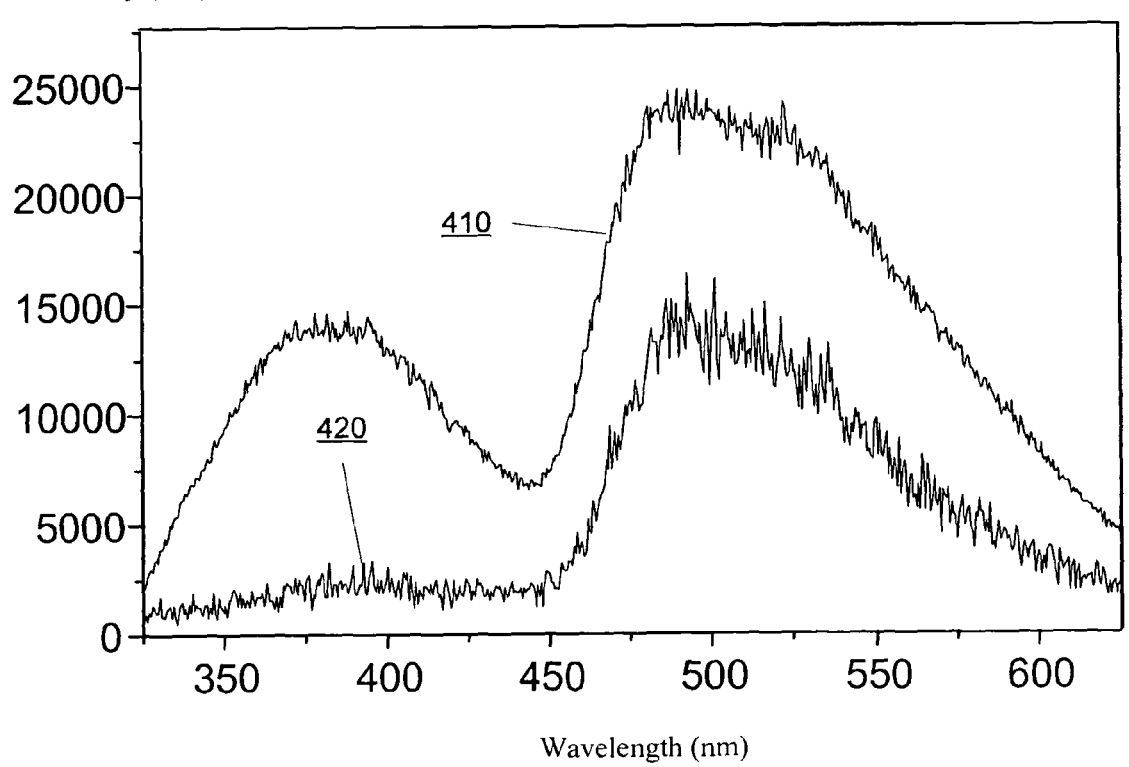
FIG. 4B shows an emission spectrum for a device having an optically pumped emissive layer placed in an electric field for a holding time.
Figure 5A:
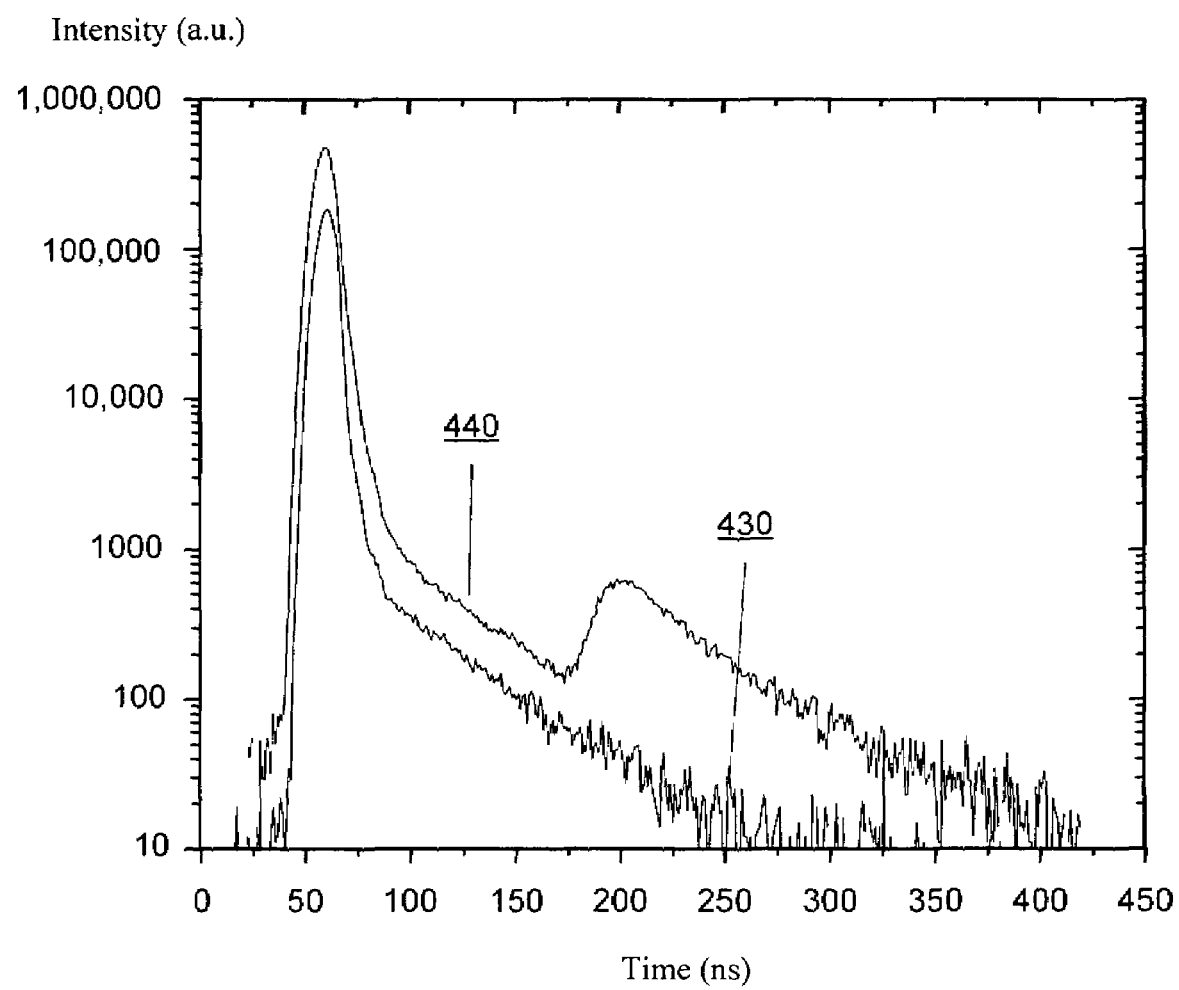
FIG. 5A shows the emission of a device having an optically pumped emissive layer placed in an electric field while and after the electric field is applied.

FIG. 4A shows a device having insulators 170, 180, disposed on either side of an emissive layer 175. The insulators may prevent current from flowing through the device when a voltage is applied to via the anode 115 and cathode 160. When the emissive layer 175 is optically pumped, excitons may form and dissociate due to the electric field created by the applied voltage as previously described. In a specific example, the emissive layer 175 may comprise CBP doped with C6 at 1% by weight, the insulating layers 170, 180 may comprise Teflon®, the anode may comprise ITO, and the cathode may comprise Al. This device was optically pumped with an $N_2$ laser at 337 nm for 0.5 ns. While the emissive layer 175 was optically pumped, a voltage was applied to the anode 115 and cathode 160, creating an electric field across the emissive layer 175. The electric field was applied for a holding time of 114 ns and then removed. FIG. 4B shows the intensity of the light emitted by the device described with respect to FIG. 4A as a function of wavelength. Plots are shown for the time periods 0-75 ns (410) and 175-275 ns (420). FIG. 5A shows the intensity of the light emitted by the device described with respect to FIG. 4A as a function of time. Plots are shown for wavelengths less than 400 nm (430) and greater than 490 nm (440).

Figure 5B:
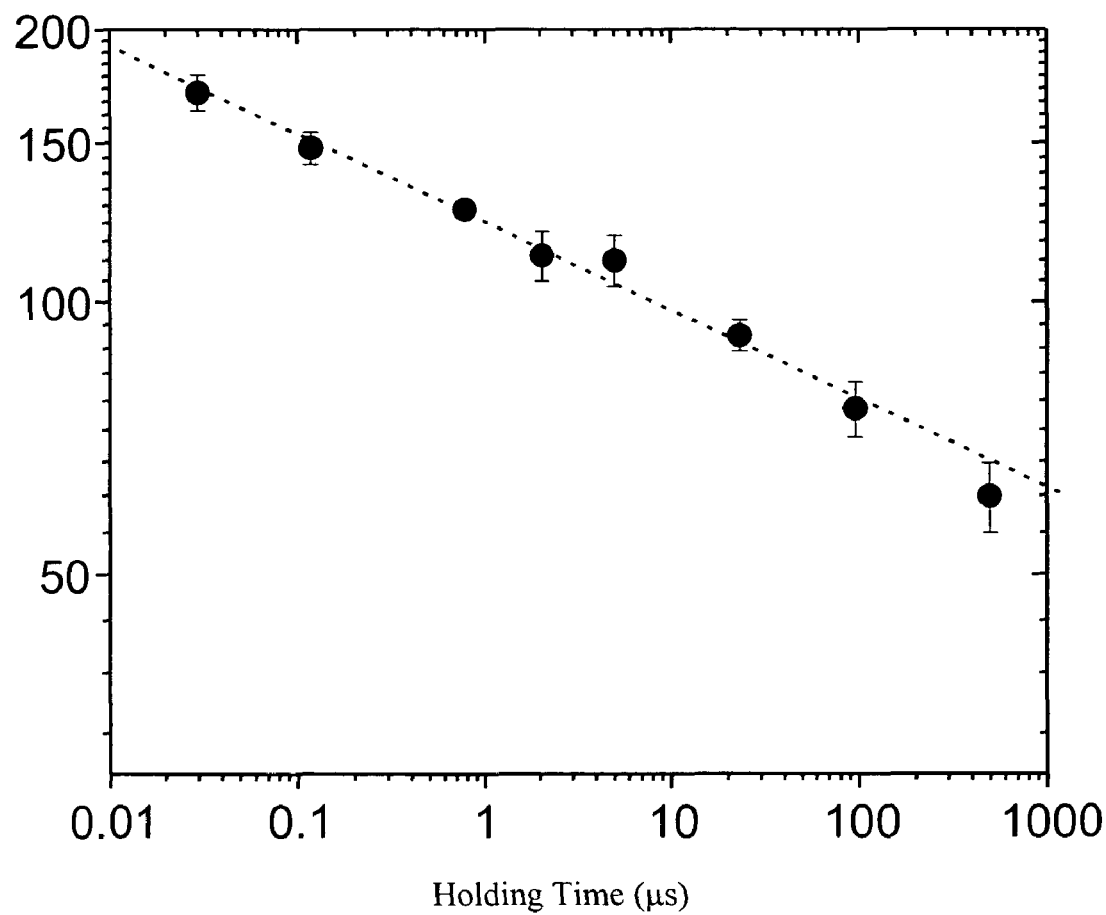
FIG. 5B shows the burst energy of a device as shown in FIG. 4A as a function of the holding time.

It may be preferred that an optically pumped emissive layer comprise a first organic material doped with a second organic material. For example, in the device described with respect to FIGS. 4A-B, a strong flash of illumination was observed for a C6-doped CBP emissive layer. No flash was apparent for the CBP, indicating that exciting only the C6 will likely not result in a high-intensity, rapid flash of illumination. FIG. 5B shows the energy of a C6 burst for the device described with reference to FIG. 4A as a function of the holding time. The burst energy declines according to $\tau^{-m}$ where m is on the order of 0.1. The power law behavior may reflect stability of the polaron pair states against dissociation, since the hopping of each carrier within the polaron pair Coulomb potential is rate-limited by thermal emission out of the exponential density of states. Energetic disorder may be required for the burst to occur since polaron pair states that relax into the tail of the density of states have restricted motion, increasing the likelihood that they will remain correlated while in the electric field.

Figure 5C:
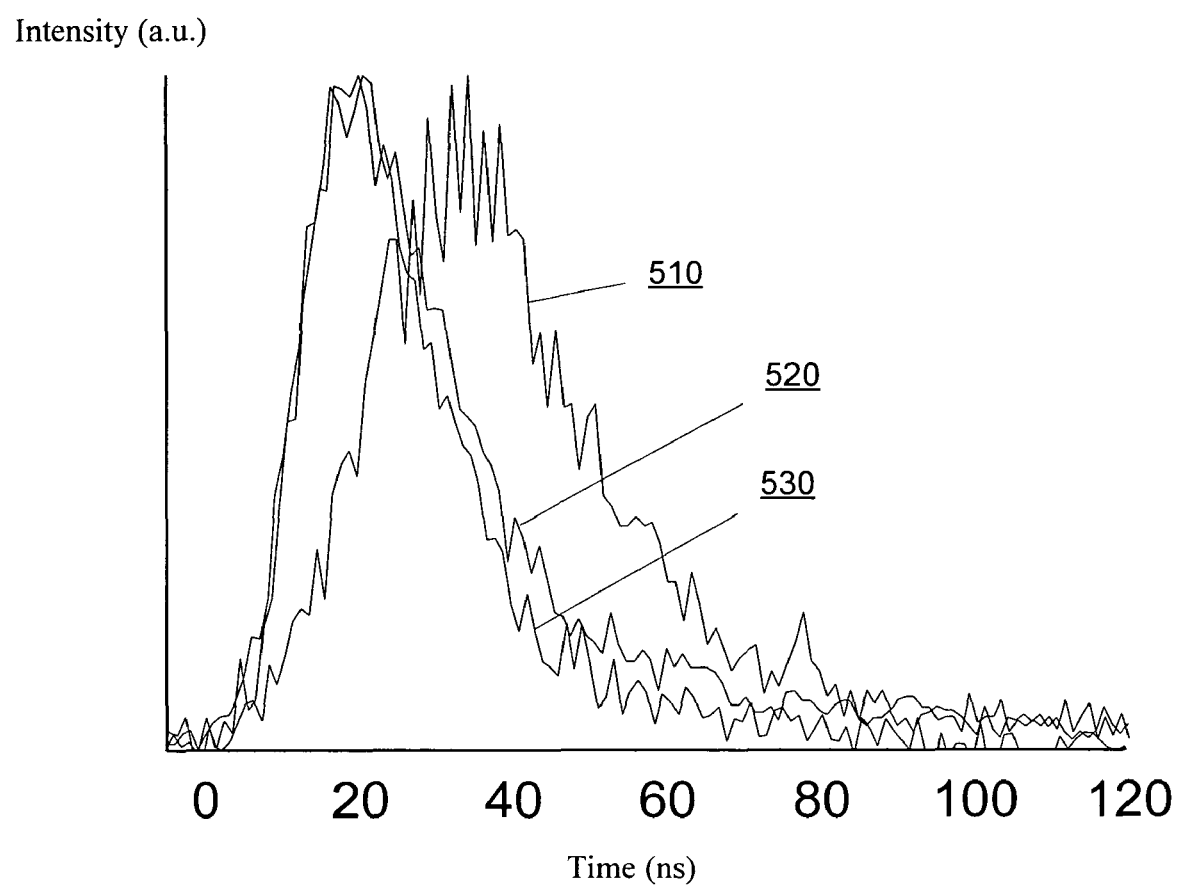
FIG. 5C shows the intensity of fluorescence bursts of a device as shown in FIG. 4A for several holding times.

The use of a host/dopant system may contribute to generation of stable polaron pair states which in turn create the fluorescence burst. The energetic difference in the HOMO levels of C6 (5.4 eV) and CBP (6.3 eV) may break the strongly-bound CBP Frenkel excitons. The hole may then localize on the C6 HOMO in the potential well created by the surrounding CBP molecules. This may further stabilize the polaron pair against complete dissociation. Such stabilization is evident in the slow power law decay of burst energy shown in FIG. 5B. It may also contribute to a surprisingly low degree of dispersion in transients over several orders of magnitude variation in $\tau$, as shown in FIG. 5C. The transients for three holding times are shown in FIG. 5C: 100 µs (510), 7 µs (520), and 0.115 µs (530).

As excitons dissociate in the presence of the electric field, an internal field opposite that of the applied field may be created. Additionally in some cases the charge carriers may dissociate entirely. It is believed that such effects may decrease polaron pair production rates, leading to a saturation of the dissociation effect. A simplified model of the number of polaron pair states n may be given by:

$$\frac{dn}{dt} = \eta(F)I_0(1 - e^{-\alpha d}) - \frac{n}{\tau_P} \quad \text{(Eq. 1)}$$

where $\eta(F)$ is the polaron pair generation efficiency as a function of the electric field F, $I_0$ is the intensity of the pump source in photon number, $\alpha$ is the absorption coefficient of the film at the pump wavelength, d is the optical pathlength traversed in the film, and $\tau_P$ is the polaron lifetime. Eq. 1 neglects any annihilation effects which, if present, could shorten the polaron lifetime. The electric field strength F across the organic layer may be modeled as:

$$F = F_A - F_P = F_A - \frac{qn}{\varepsilon} \quad \text{(Eq. 2)}$$

where $F_A$ is the applied field strength, $F_P$ is the internal field generated by geminate polaron pairs, q is the charge of a single charge carrier, n is the number of charge carriers, and $\varepsilon$ is the permittivity of the organic layer.

Figure 6A:
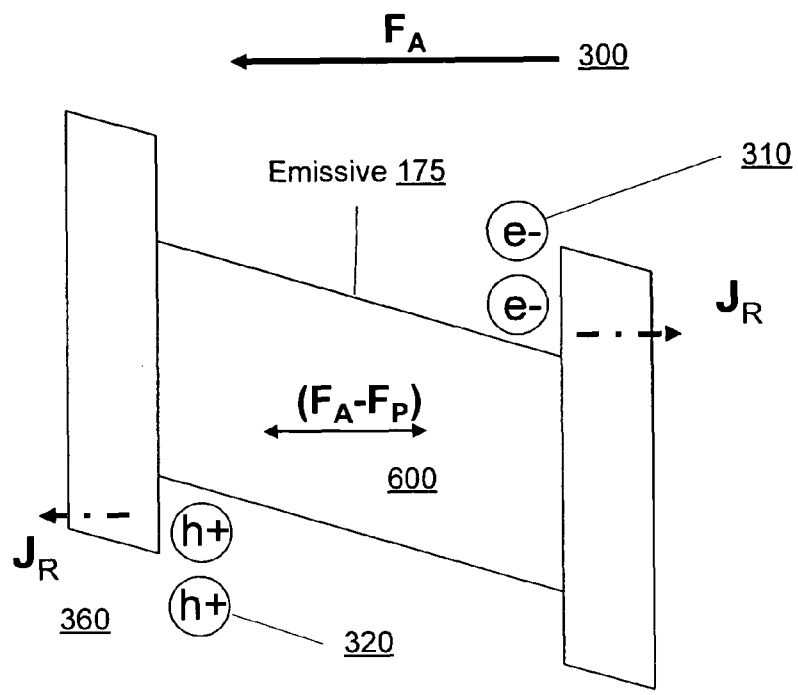
FIG. 6A shows a schematic diagram of a build up of dissociated states and a recombination current.

To counteract this effect, a recombination current may be introduced to reduce charge build up. Such a current is illustrated in FIG. 6A. As charge carriers 310, 320 within the emissive layer 175 build up as a result of exciton dissociation, an internal field $F_P$ may be created. The effective field 600 within the emissive layer is then $F_A$-$F_P$. To reduce this effect, a recombination current 360 $J_R$ may be introduced. Tunneling properties of charge carriers and insulating layers may be used to create the recombination current.

Figure 6B:
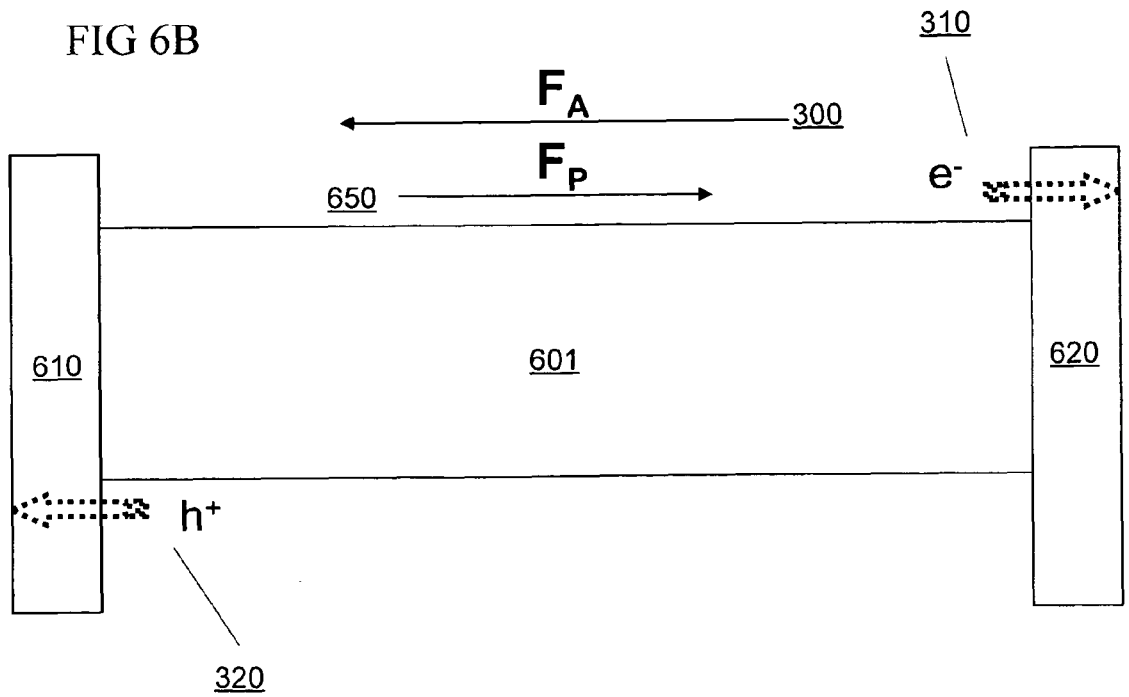
FIG. 6B shows a portion of an organic light emitting device having insulating layers that allow a tunneling current.

FIG. 6B shows a portion of a device having an emissive layer 601 with insulating layers 610, 620 disposed on either side of the emissive layer. The insulating layers 610, 620 are preferably thin enough that a desired number of charge carriers may tunnel through the layers. The recombination current, and hence the internal field $F_P$ 650 may then be adjusted by adjusting the thickness of the insulating layers 610, 620. In a specific configuration, a device according to the invention may comprise a 1600 Å emissive layer 601 comprising CBP doped with C6 at 4% by weight, and 200 Å insulating layers 610, 620 comprising Teflon®.

Methods and devices according to the invention may allow for creation of an organic laser. It is believed that no spin mixing occurs in the geminate polaron pair state. Since created singlet polaron pair states remain singlet states (i.e., no polaron and triplet absorption or annihilation with singlet states occurs), coherent light may be produced. If an OLED is used as an optical pump with a pumped device as previously described, an electrically-driven device may be created. Peak brightnesses of over 20 times the steady-state brightness (i.e., the brightness of light emitted by a pumped organic layer in the absence of an electric field) have been achieved. It is believed that an additional increase of about five times the peak luminescence may be achieved, allowing for lasing by the pumped organic laser.

Figure 7A:
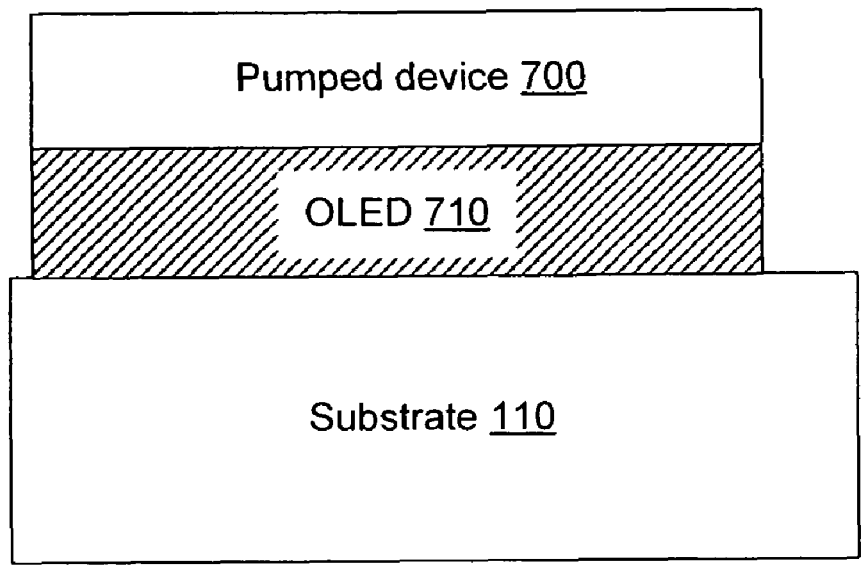
FIG. 7A shows a device having an optically pumped organic light emitting device and an organic light emitting device.
Figure 7B:
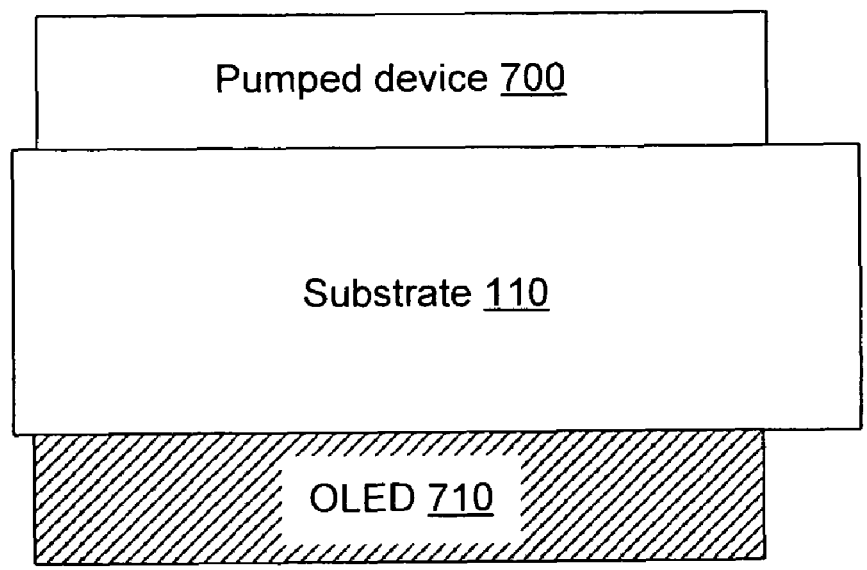
FIG. 7B shows a device having an optically pumped organic light emitting device and an organic light emitting device.

FIGS. 7A-B show exemplary configurations of such a device. FIG. 7A shows a device comprising a substrate 110, an OLED 710, and a pumped emissive device 700. The OLED and the pumped emissive device may be deposited on the substrate using various methods known in the art. The OLED may be, for example, a device as described with respect to FIGS. 1-2. Various layers such as blocking layers, transport layers, and emissive layers may be included as previously described. The OLED 710 may also be a stacked OLED, or other configuration as previously described. The pumped emissive device 700 may comprise an emissive layer, insulating layers, and electrodes as previously described, for example with reference to FIG. 4A. Other layers may be present. A voltage may be applied to the OLED 710, causing it to emit light. The light emitted by the OLED 710 may then pump the pumped emissive device 700. If an electric field is applied to the pumped layer 700 and reduced or removed, the pumped emissive device may emit a short, high-intensity pulse of light as previously described. The pumped emissive device may comprise, for example, a light-emitting organic layer disposed between electrodes, as described herein.

FIG. 7B shows another configuration of a device according to the invention. An OLED 710 and a pumped emissive device

700 may be disposed on either side of a substrate 110. For example, the OLED 710 and the pumped emissive device 700 may be deposited on opposite sides of the substrate 110 using methods known in the art. A voltage may be applied to the OLED, causing it to emit light. It is preferred that the substrate 110 be substantially transparent to a majority of the wavelengths of light emitted by the OLED, allowing the OLED to pump the pumped device 700. An electric field may be applied to the pumped emissive device 700 as previously described, causing it to emit a short, high-intensity pulse of light.

Figure 7C:
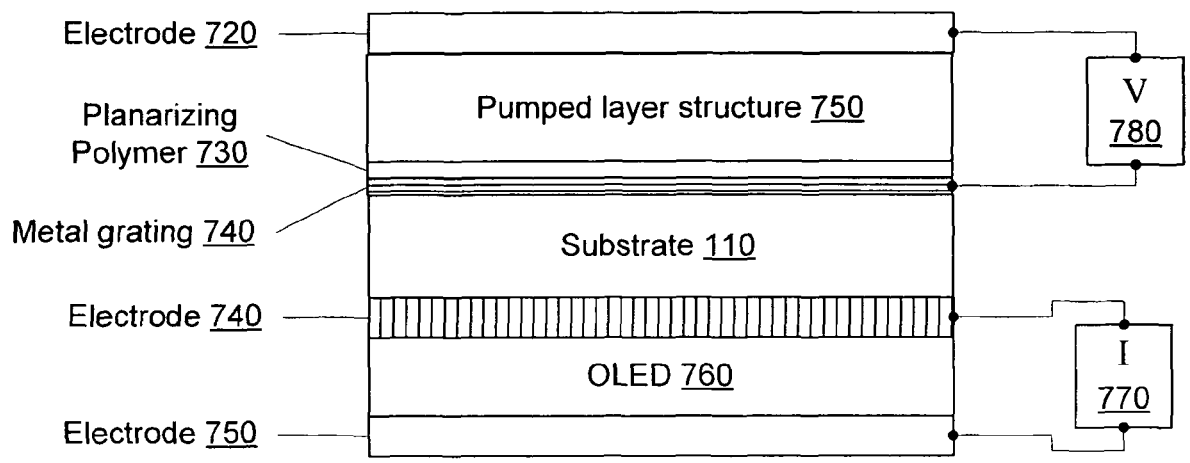
FIG. 7C shows a device having an optically pumped organic light emitting device, an organic light emitting device, a planarizing polymer layer, and a metal grating.

Another configuration of a device according to the invention is shown in FIG. 7C. The device comprises an OLED 750 disposed between two electrodes 740, 750 on one side of a substrate 110. When a current 770 is applied across the OLED 750, it may emit light. The OLED 750 may comprise various layers as previously described. It may be preferred that OLED 750 be a stacked OLED. Light emitted by the device may pass through the substrate 110, which may be partially or fully transparent to wavelengths of light emitted by the OLED 760. The device further comprises a pumped layer structure 750 disposed on the opposite side of the substrate 110. The pumped layer structure 750 may comprise various layers, including one or more emissive layers. A voltage source 780 may be used to apply an electric field across the pumped layer structure. The electric field may be applied for a holding time as described herein. The device may further comprise a planarizing polymer 730 to block electrical current from being transmitted through the pumped layer structure when a voltage is applied. The voltage source 780 may be applied to an electrode 720 and a metal grating 740 disposed on opposite sides of the pumped layer structure 750. Other layers may be included in the device. For example, additional polymer or other insulating layers may be included to further block transmission of a current through the pumped layer structure.

It is understood that the various embodiments described herein are by way of example only, and are not intended to limit the scope of the invention. For example, many of the materials and structures described herein may be substituted with other materials and structures without deviating from the spirit of the invention. It is understood that various theories as to why the invention works are not intended to be limiting. For example, theories relating to charge transfer are not intended to be limiting.

Material Definitions:
As used herein, abbreviations refer to materials as follows:
CBP: 4,4'-N,N-dicarbazol-biphenyl
m-MTDATA 4,4',4"-tris(3-methylphenylphenlyamino)triphenylamine
$Alq_3$: 8-tris-hydroxyquinoline aluminum
Bphen: 4,7-diphenyl-1,10-phenanthroline
n-BPhen: n-doped BPhen (doped with lithium)
$F_4$-TCNQ: tetrafluoro-tetracyano-quinodimethane
p-MTDATA: p-doped m-MTDATA (doped with $F_4$-TCNQ)
$Ir(ppy)_3$: tris(2-phenylpyridine)-iridium
$Ir(ppz)_3$: tris(1-phenylpyrazoloto,N,C(2')iridium(III)
BCP: 2,9-dimethyl-4,7-diphenyl-1,10-phenanthroline
TAZ: 3-phenyl-4-(1'-naphthyl)-5-phenyl-1,2,4-triazole
CuPc: copper phthalocyanine.
ITO: indium tin oxide
NPD: N,N'-diphenyl-N—N'-di(1-naphthyl)-benzidine
TPD: N,N'-diphenyl-N—N'-di(3-toly)-benzidine
BAlq: aluminum(III)bis(2-methyl-8-hydroxyquinolinato)4-phenylphenolate
mCP: 1,3-N,N-dicarbazole-benzene
DCM: 4-(dicyanoethylene)-6-(4-dimethylaminostyryl-2-methyl)-4H-pyran
DMQA: N,N'-dimethylquinacridone
PEDOT:PSS: an aqueous dispersion of poly(3,4-ethylene-dioxythiophene) with polystyrenesulfonate (PSS)
C6: 3-(2-benzothiazolyl)-7-(diethylamino)coumarin (Coumarin-6)

Experimental:
Specific representative embodiments of the invention will now be described, including how such embodiments may be made. It is understood that the specific methods, materials, conditions, process parameters, apparatus and the like do not necessarily limit the scope of the invention.

Figure 8A:
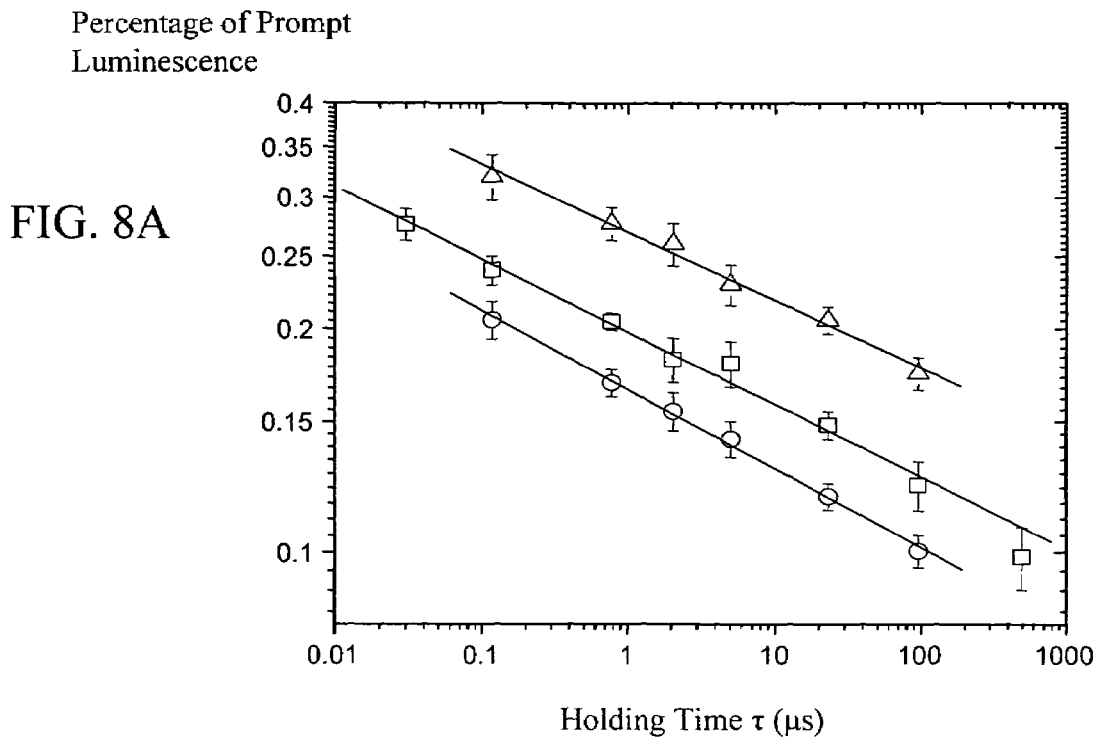
FIG. 8A shows flash energy vs. holding time for an optically pumped organic light emitting device placed in an electric field for a holding time.

A device having a 1000 Å organic emissive layer comprising CBP doped with C6 at 4% by weight was fabricated. The layer was optically pumped while various electrical fields were applied for a range of holding times. FIG. 8A shows the flash energy (i.e., energy of the flash generated when the electric field was removed) vs. holding time for the device. The percentage of prompt luminescence is shown as a function of holding time for field strengths of 1.5 MV/cm (circles), 2.0 MV/cm (squares), and 2.5 MV/cm (triangles). The flash energy for a holding time τ was observed to decay proportionally to $\tau^{-1/10}$ independent of the applied field strength.

Figure 8B:
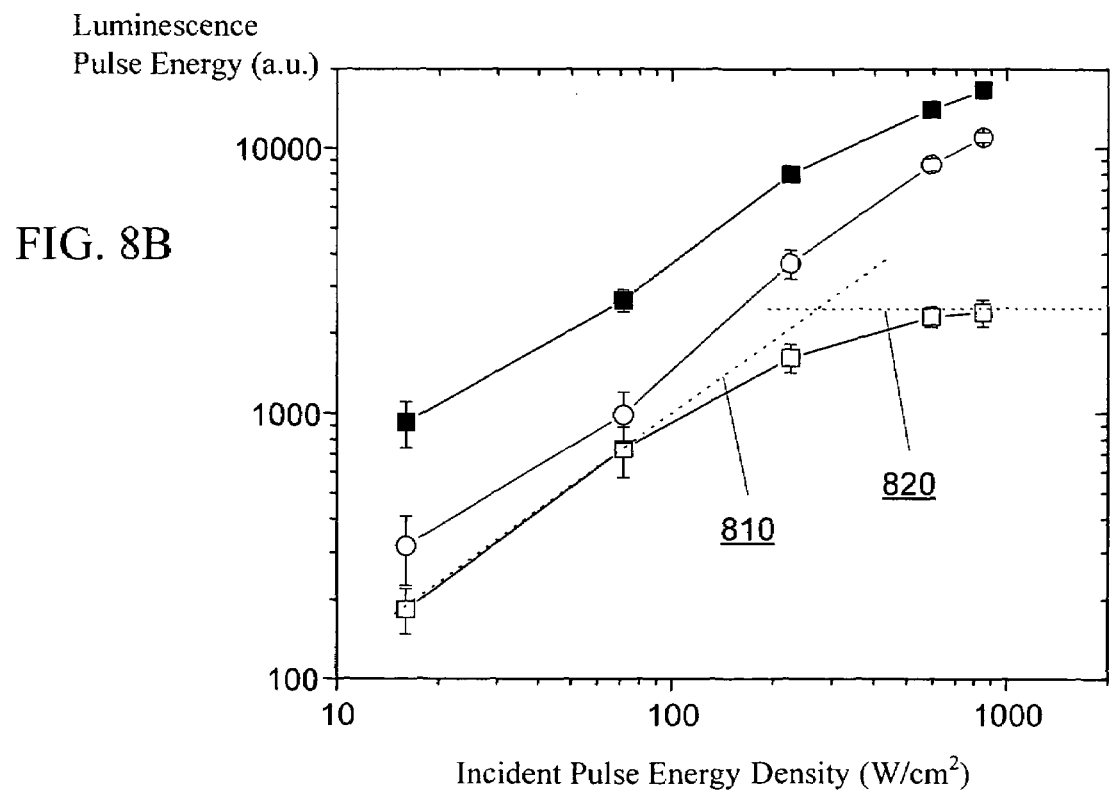
FIG. 8B shows luminescence trends vs. incident pulse energy for an optically pumped organic light emitting device placed in an electric field for a holding time.

Pulses of light at various energy densities were used to pump the emissive layer while a 2 MV/cm field was applied for a holding time of 775 ns, and the resulting pulse energy was measured. FIG. 8B shows the luminescence pulse energy as a function of the incident pulse energy density for the C6 prompt (solid squares), the CBP prompt (circles), and the flash energy (open squares). The flash energy was approximately linear prior to saturation of the geminate polaron pair states (810), but non-linear with increasing incident pulse energy (820).

Figure 8C:
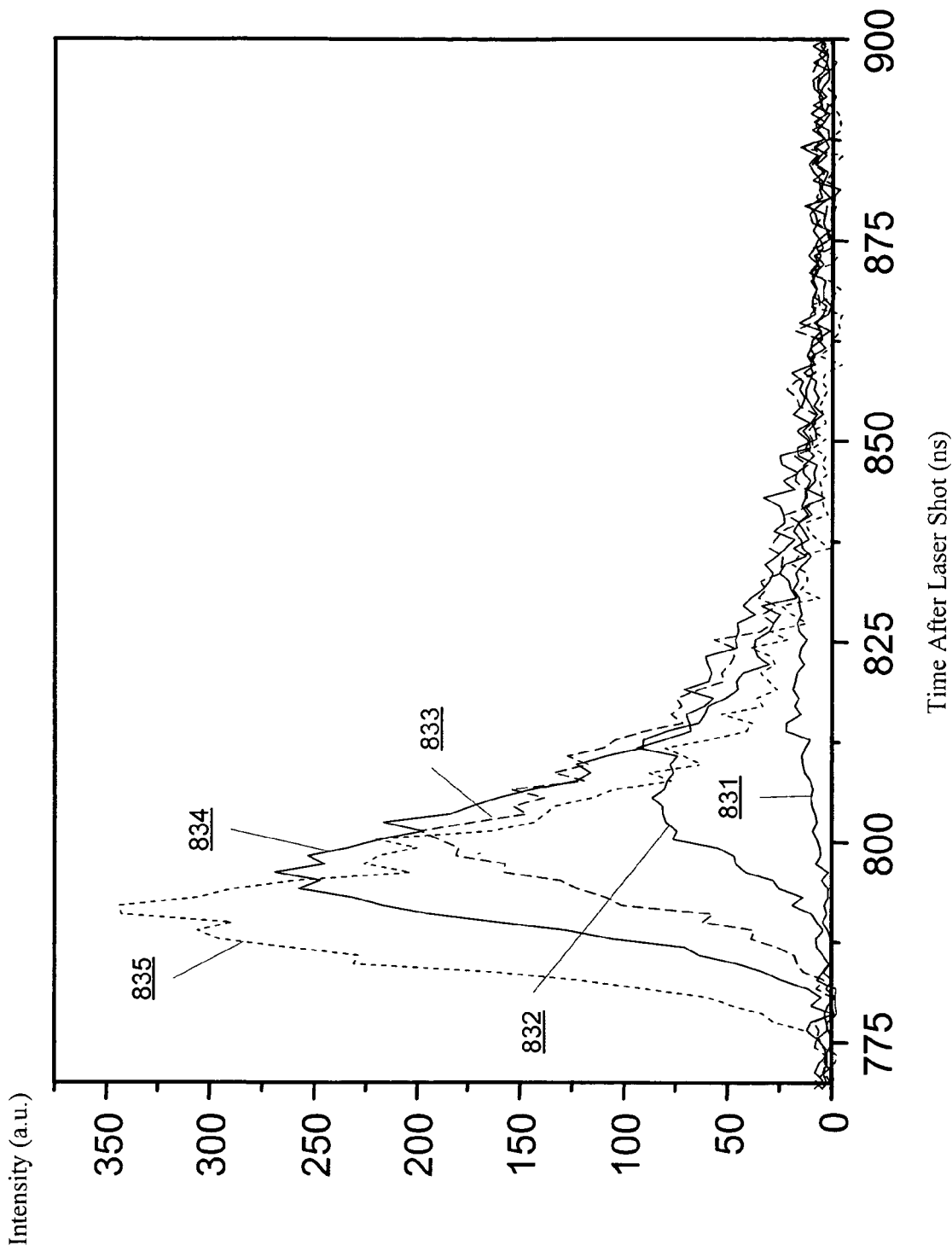
FIG. 8C shows flash trends vs. field amplitudes for an optically pumped organic light emitting device placed in an electric field for a holding time.
Figure 8D:
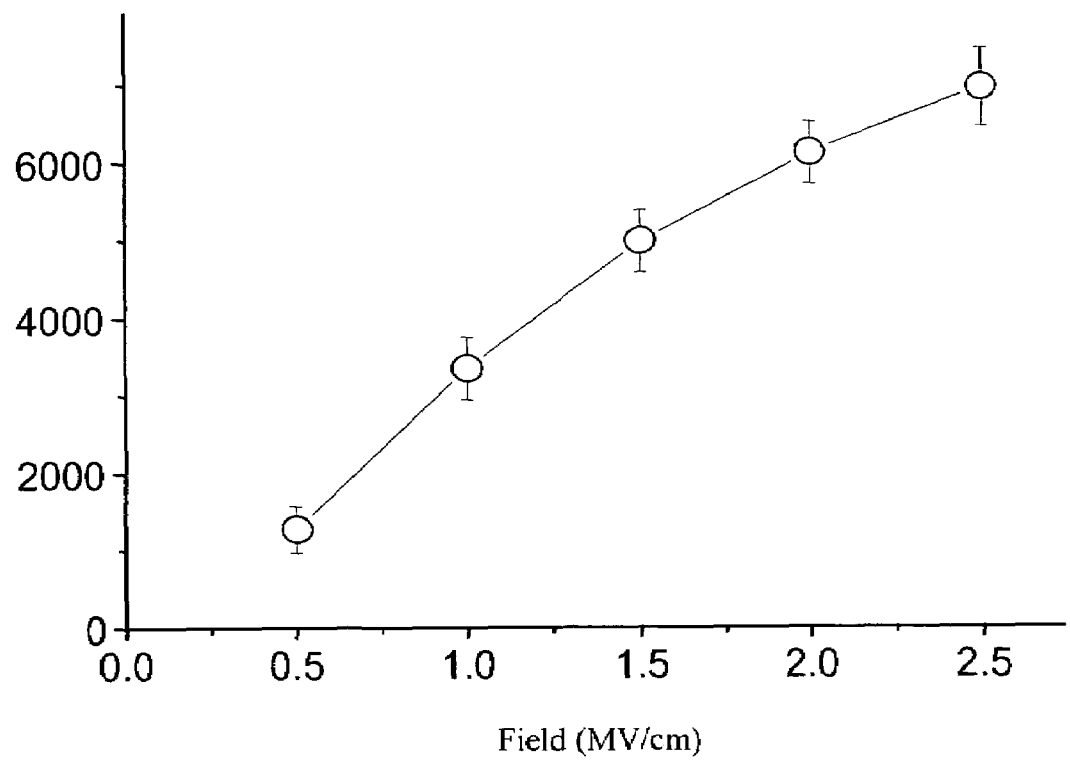
FIG. 8D shows flash integrals vs. applied fields for the runs shown in FIG. 8C.

FIG. 8C shows the intensity of the flash emitted by the pumped organic layer after an electric field was applied and removed. The electric field was generated by applying voltages of 10 MV (831), 20 MV (832), 30 MV (833), 40 MV (834), and 50 MV (835) to electrodes disposed on either side of the organic layer. FIG. 8D shows the flash integral for the same trials as a function of the applied field. As shown in FIGS. 8C-D, the intensity of the flash emitted by the pumped organic layer when the electric field was removed was observed to have a higher peak and decrease more rapidly as the applied voltage was increased.

Figure 9A:
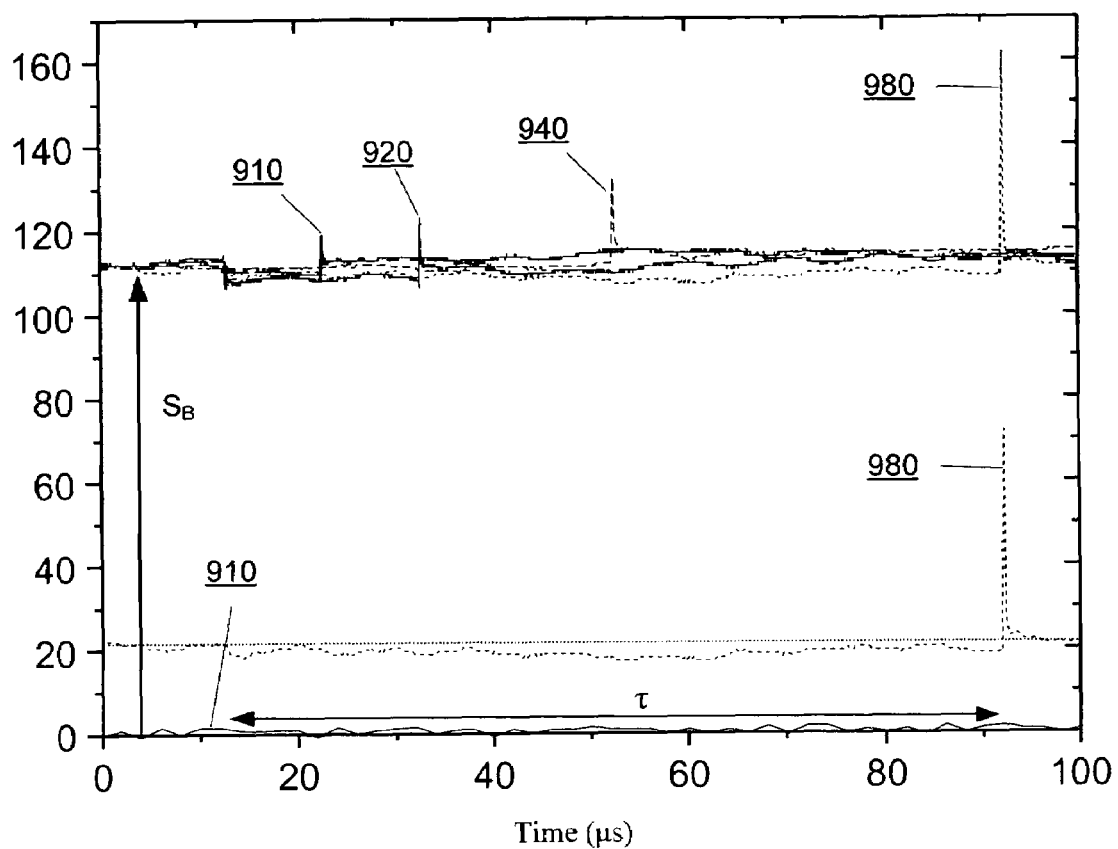
FIG. 9A shows the optical capacitance of an optically pumped organic light emitting device placed in an electric field for a holding time.
Figure 9B:
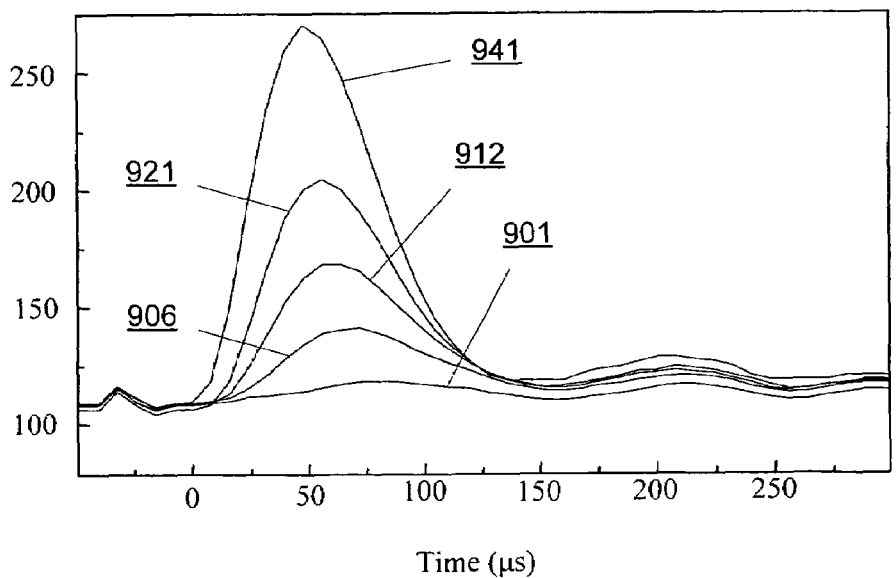
FIG. 9B shows the burst intensity for various holding times.

A device with the structure ITO/500 Å Teflon/500 Å 4% wt C6 in CBP/500 Å Teflon/Al was constructed, and optically pumped with 325 nm light. An electric field of about 2 MV/cm was applied across the device with a holding time of τ, and light emission of the device was measured with an avalanche photodetector (APD). FIG. 9A shows the optical capacitance of the device over a long time period. The APD response as a function of time for pumping times of 10 μs (910), 20 μs (920), 40 μs (940), and 80 μs (980) is shown. FIG. 9B shows a magnified view of the increase in burst intensity with τ for τ=10μ (901), 60 μs (906), 120 μs (912), 200 μs (921), and 400 μs (941); the burst transients are limited by the APD frequency response.

Figure 10:
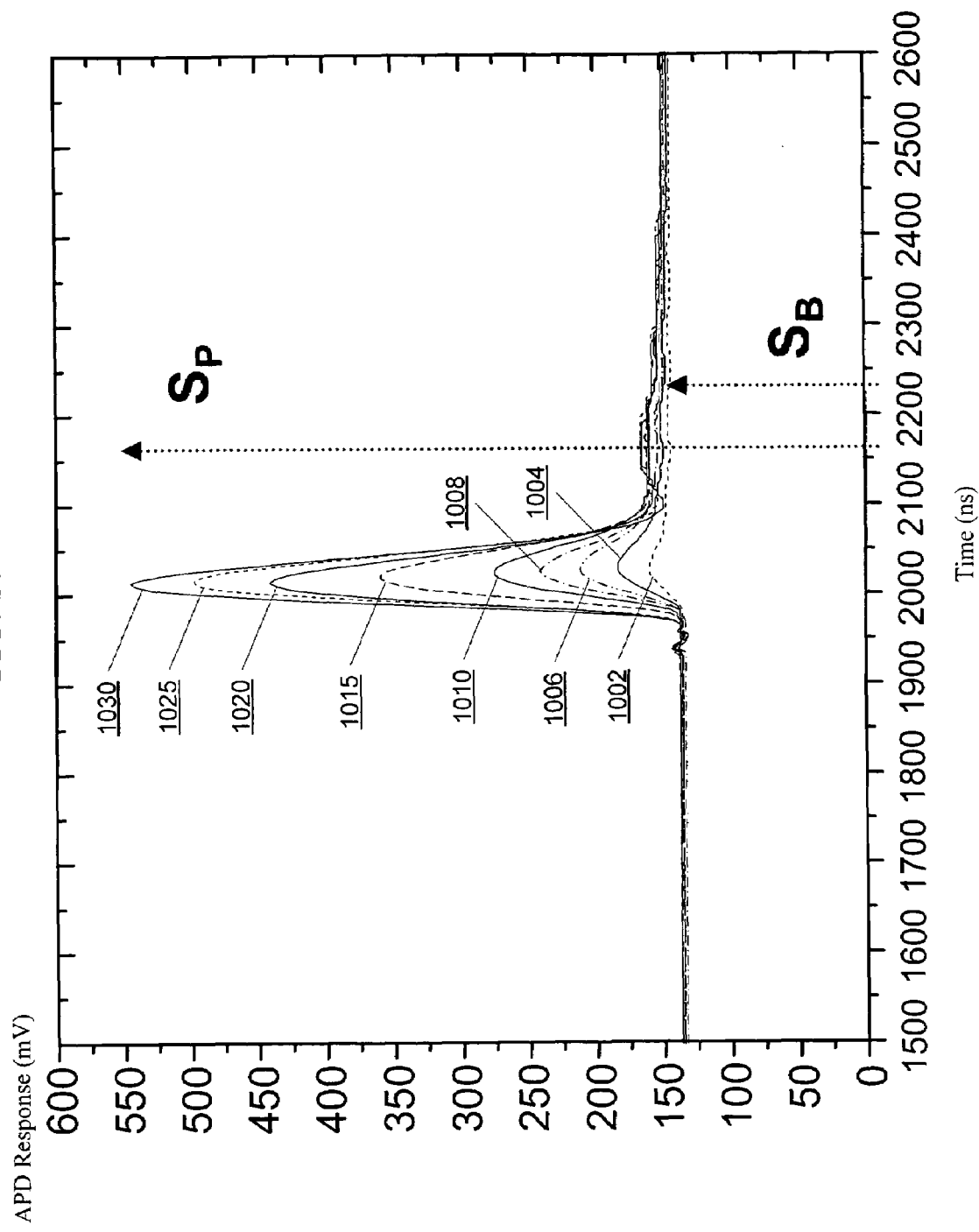
FIG. 10 shows observed pulses of light emitted from an optically pumped organic light emitting device placed in an electric field for a holding time.

FIG. 10 shows the APD response as a function of time in the region near a pulse flash emitted by the organic emissive layer. Plots are shown for the following holding times: 20 μs (1002), 40 μs (1004), 60 μs (1008), 80 μs (1008), 100 μs (1010), 150 μs (1015), 200 μs (1020), 250 μs (1025), and 300 μs (1030). No field was applied for about 20 ms between applied field pulses. As shown in FIG. 10, a longer holding time generally results in a higher emitted pulse.

Figure 11:
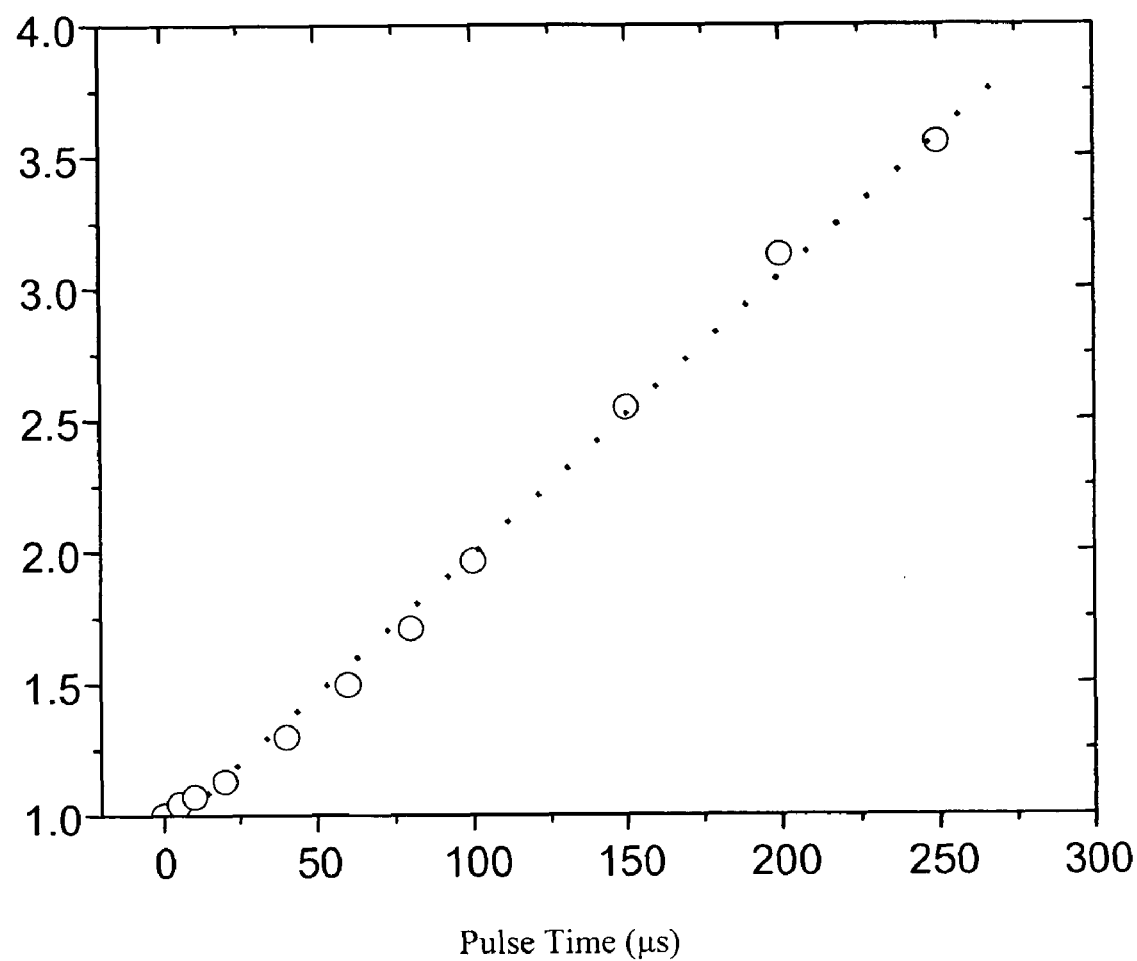
FIG. 11 shows the flash characteristic for an optically pumped organic light emitting device placed in an electric field for a holding time.

A value of interest for a pulse emitted by a pumped organic layer when an electric field is applied across the organic layer for a holding time τ is the "enhancement factor" M, defined as:

$$M = \frac{S_P}{S_B} \quad \text{(Eq. 3)}$$

where $S_B$ is the level of steady-state emission of the device, i.e., the emission observed when the organic emissive layer is optically pumped in the absence of an electric field, and $S_P$ is the level of the peak of the emitted pulse. FIG. 11 shows enhancement factors corresponding to the applied field pulses described with reference to FIG. 10. Applied field pulses with holding times from 20 μs to 10 ms were applied. The enhancement factor was found to be roughly linearly related to the holding time, as shown in FIG. 11, up to holding times of about 1 ms. For longer holding times, the relationship was no longer linear.

Figure 12A:
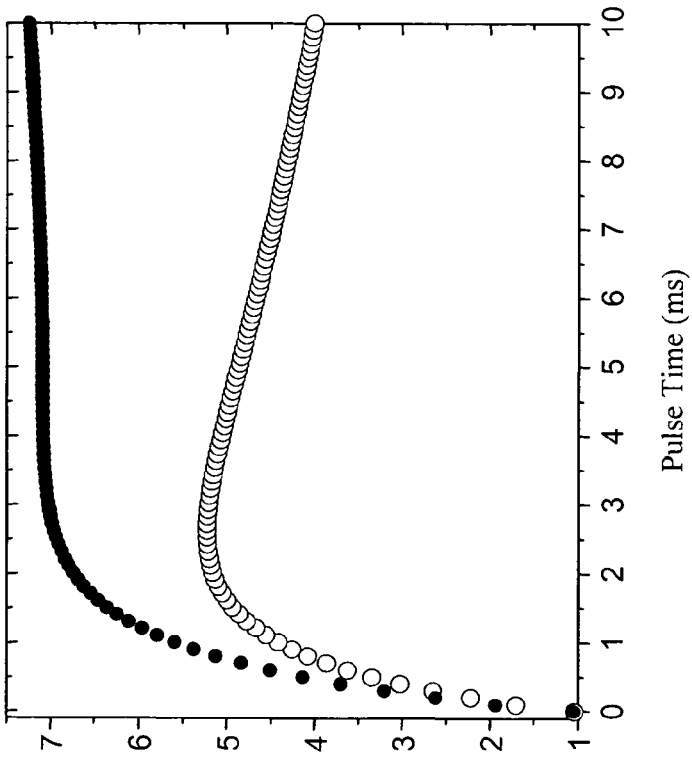
FIG. 12A shows a simulation of enhancement factors vs. pulse times for an optically pumped organic light emitting device placed in an electric field for a holding time.
Figure 12B:
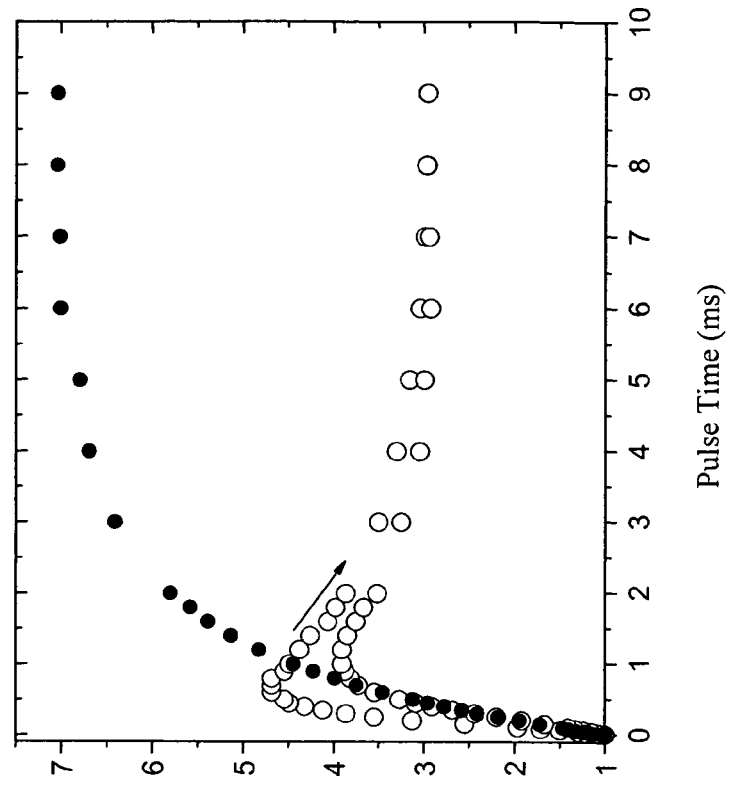
FIG. 12B shows experimental data for the configuration simulated in FIG. 12A.

As described above with reference to Eq. 1, the geminate pair polaron states in an optically-pumped emissive layer disposed within an applied electric field may become saturated. FIG. 12A shows a simulated flash profile for a C6-doped layer pumped by a constant-energy source of 1.2 W/cm² at 445 nm, disposed within an applied field of 2 MV/cm for holding times of 1 ms (filled circles) and 900 μs (open circles). For the simulation, κ was approximated as $\kappa_0 \sim 10^{-4}$, and η was approximated as $\eta_0 \sim 10^{-6}$. FIG. 12B shows experimental data under the same conditions, for holding times of 1 ms (filled circles) and 900 μs (open circles). As previously indicated, for holding times higher than about 1 ms, the enhancement factor no longer increases linearly with the holding time.

Figure 13A:
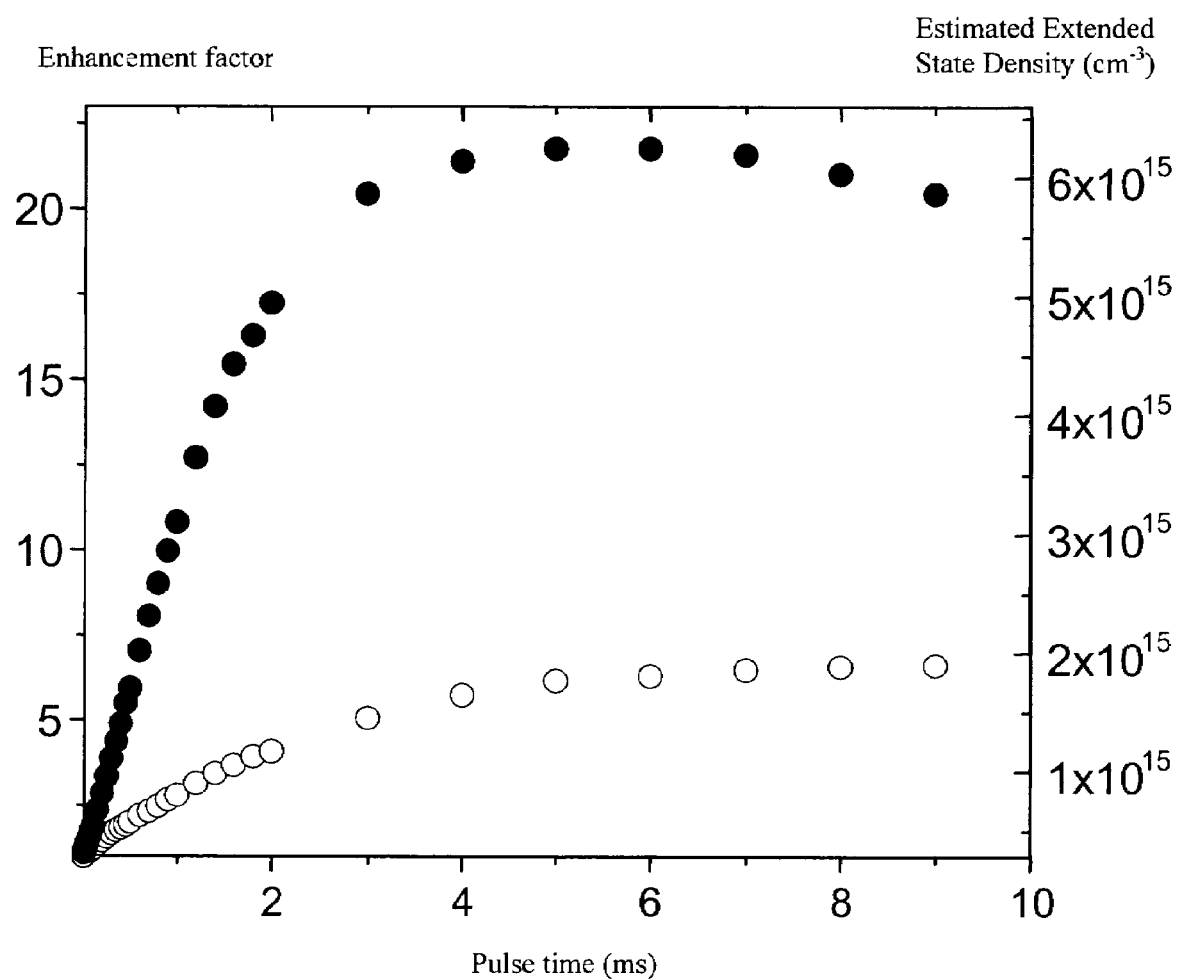
FIG. 13A shows a comparison of flash performance for two optically pumped organic light emitting devices placed in an electric field for a holding time.
Figure 13B:
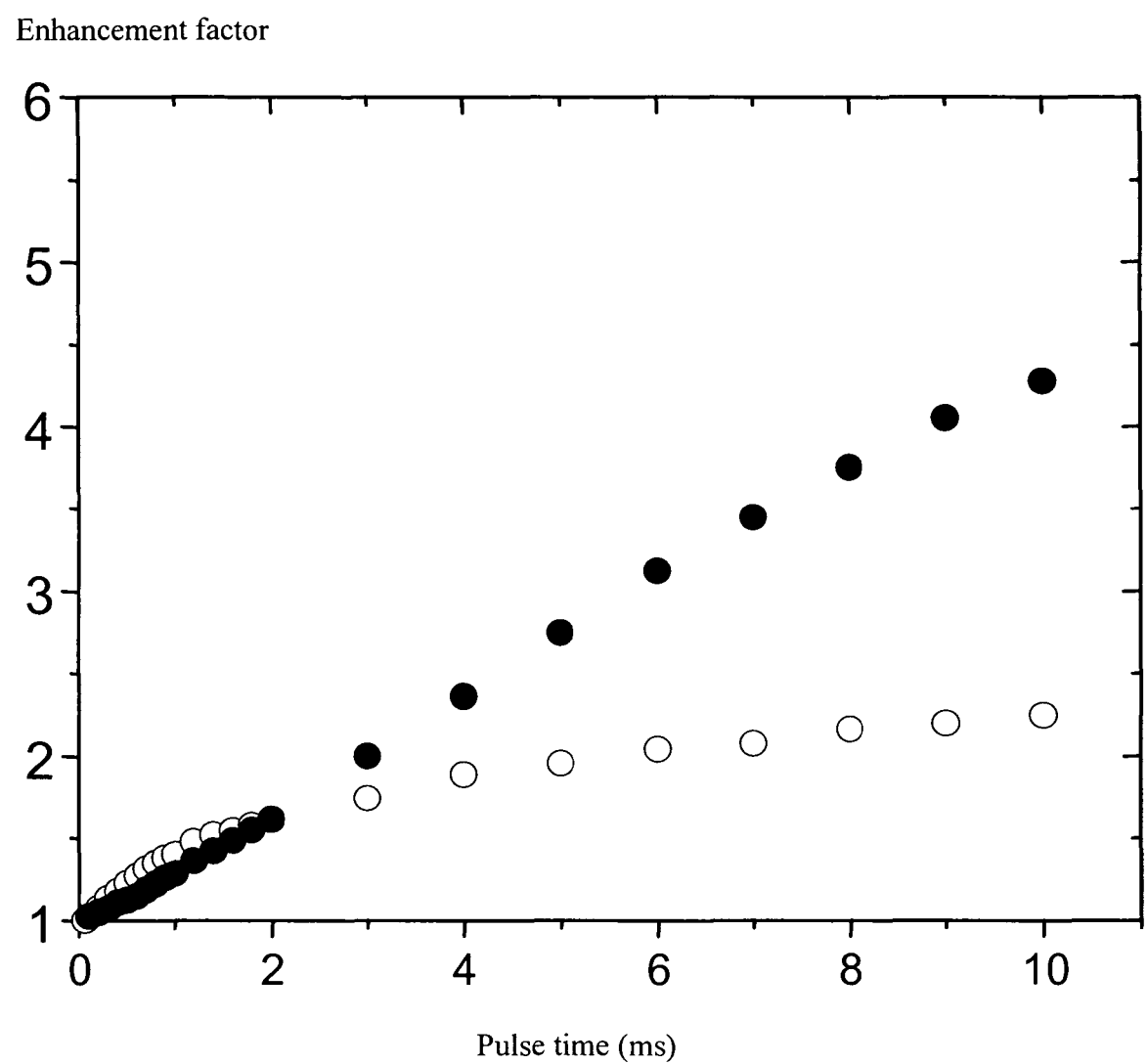
FIG. 13B shows the comparison shown in FIG. 13A for a lower temperature.
Figure 13C:
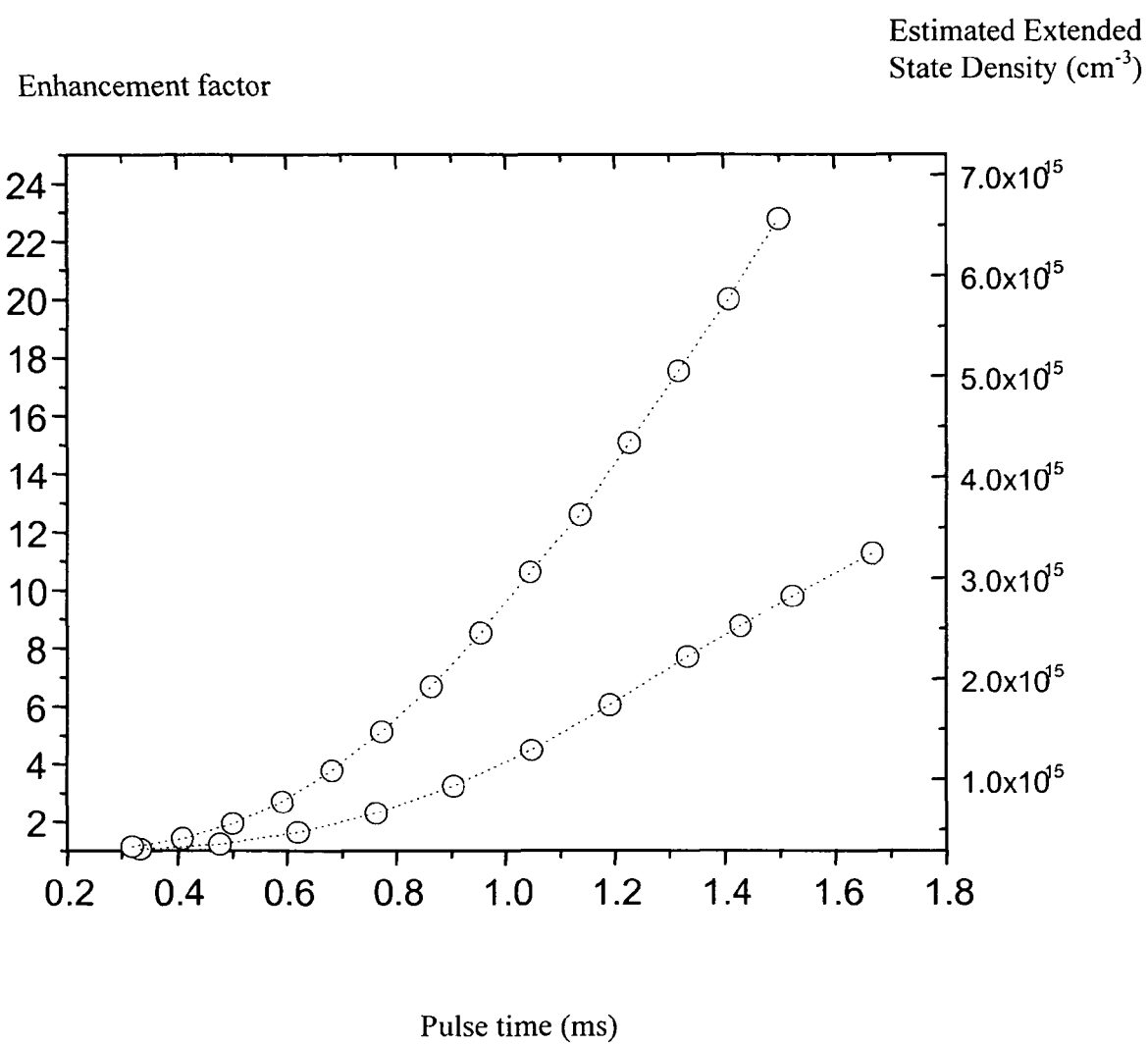
FIG. 13C shows the field dependence of a flash produced by an optically pumped organic light emitting device placed in an electric field for a holding time.

To make use of a tunneling current as a recombination current, a device having a 1600 Å layer of CBP doped with C6 disposed between two insulating layers of Teflon® was fabricated. FIGS. 13A-B show the flash profile of the device at temperatures of 295 K (FIG. 13A) and 12 K (FIG. 13B). Devices having insulating layers of 100 Å with an applied field of 1.2 MV/cm (open circles) and 200 Å with an applied field of 1.4 MV/cm (closed circles) were fabricated. In each case, an interpulse reverse bias of −5 V (−0.24 MV/cm) was generated. FIG. 13A illustrates a pulse emitted by the organic layer with an intensity as high as 20 times the steady-state emission. At lower temperatures, there is a further decrease in the recombination current, resulting in the saturation bend occurring at longer pulse widths. FIG. 13C shows the field dependence of the flash for a 10 ms holding time at 295 K. The closed circles represent data for a device with 200 Å insulating layers and a 10 ms holding time. The closed circles represent data for a device with 100 Å insulating layers and a 5 ms holding time. In each case, a −5 V (−0.24 MV/cm) interpulse reverse bias was generated.

Figure 14:
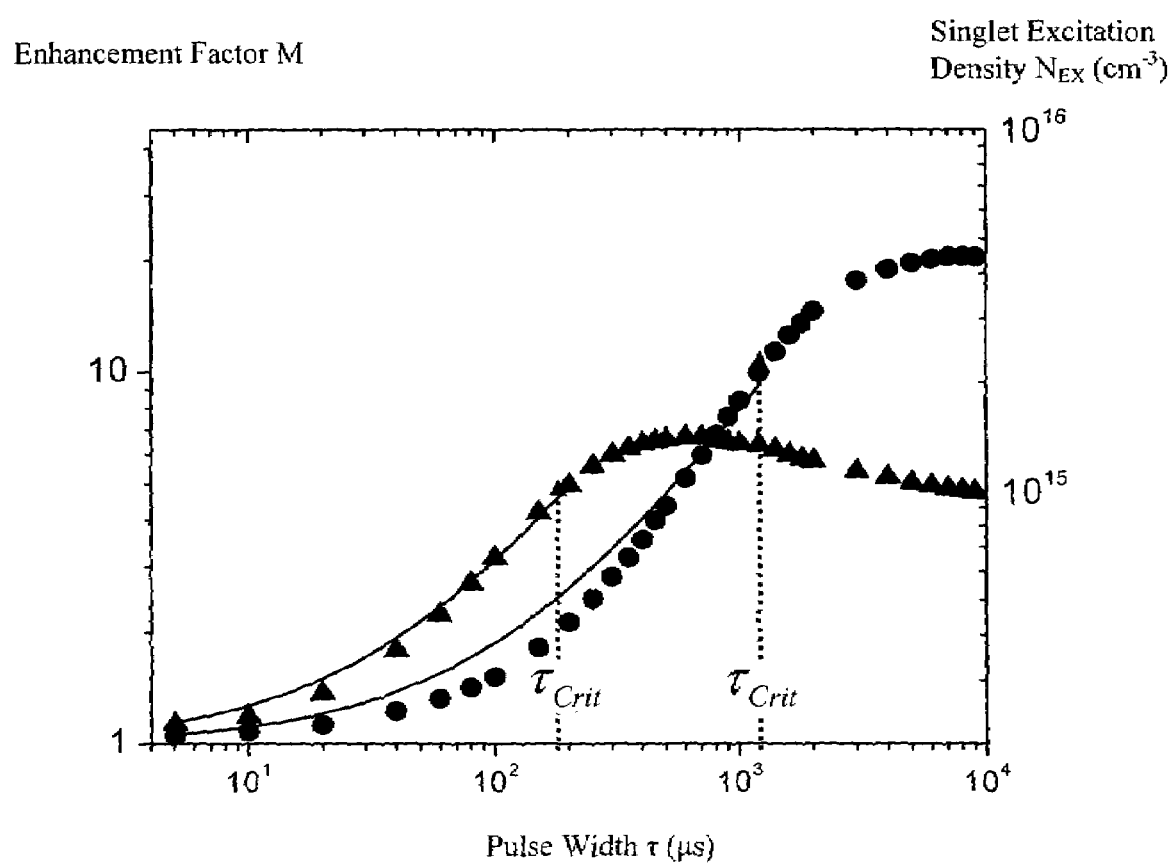
FIG. 14 shows the enhancement factor and singlet excitation density for devices having insulating and active layers of different thicknesses.

The enhancement factor may also be used to quantify the intensity of a burst. FIG. 14 shows the enhancement factor M as a function of pulse width T for two devices of different insulating barrier thickness $\chi_{INS}$, but identical total device thickness. The circles are for a device having a barrier thickness $\chi_{INS}$=20 nm and an active layer thickness $\chi_{AL}$=160 nm; the triangles are for a device having a barrier thickness $\chi_{INS}$=50 nm and an active layer thickness $\chi_{AL}$=100 nm. The excited state density of the burst, $N_{EX}$ may be approximated by estimating the steady-state C6 singlet density $N_{SS}$ as:

$$N_{SS} = \frac{I_0 \left(\frac{\lambda}{qhc}\right)[0.86]\phi_{C6}\tau_{C6}}{2L_{ABS}} \quad \text{(Eq. 4)}$$

and scaling as $N_{EX}$=$MN_{SS}$. In Eq. 4, $I_0$ is the incident laser intensity in W/cm², q is the elemental charge, and h is Planck's constant. Since the active layer thickness, $\chi_{AL}$=100 nm, is double the CBP absorption length, $L_{ABS}$=50 nm at λ=325 nm, roughly 86% ($1-e^{-\chi_{AL}/L_{ABS}}$) of the incident pump is absorbed in a single pass through the active layer, making cathode reflection and other microcavity effects negligible. The fraction $\phi_{C6}$~78%, of CBP excitations are transferred to C6 molecules, as estimated from the relative magnitudes of CBP and C6 emission in the photoluminescence spectrum. Thus, Eq. 4 may be used to provide an estimate of the average steady-state C6 single density in the active layer.

The early τ portions of each curve may be fit using the polaron pair state decay power law with m=0.1:

$$M = \frac{N_{SS} + N_{PP0}t^{1-m}}{N_{SS}} = 1 + \frac{N_{PP0}}{N_{SS}}t^{1-m} \quad \text{(Eq. 5)}$$

where $N_{PP0}$ is the number of initially generated singlets that can undergo singlet→polaron pair→singlet conversion. The roll-off onset in M occurring at $\tau_{Crit}$ (see FIG. 14) may result from a build-up of space charge over time due to those polaron pairs that dissociate completely. This space charge may create an opposing internal field opposite the applied field, reducing M. As shown in FIG. 14 and as previously described, a thinner insulating barrier may allow some of the accumulated space charge to tunnel out of the device. For the devices described with respect to FIG. 14, the device with the thinner insulating layer displays an improvement in $\tau_{Crit}$ of a factor of 6 and an increase in the peak enhancement to M=22, corresponding to a C6 singlet density of $N_{EX}$=4×10¹⁵ cm⁻³. In contrast, electrical generation of comparable singlet density could require a current density of J>30 A/cm², at which range pump-induced absorption and annihilation losses may be significant.

Figure 15:
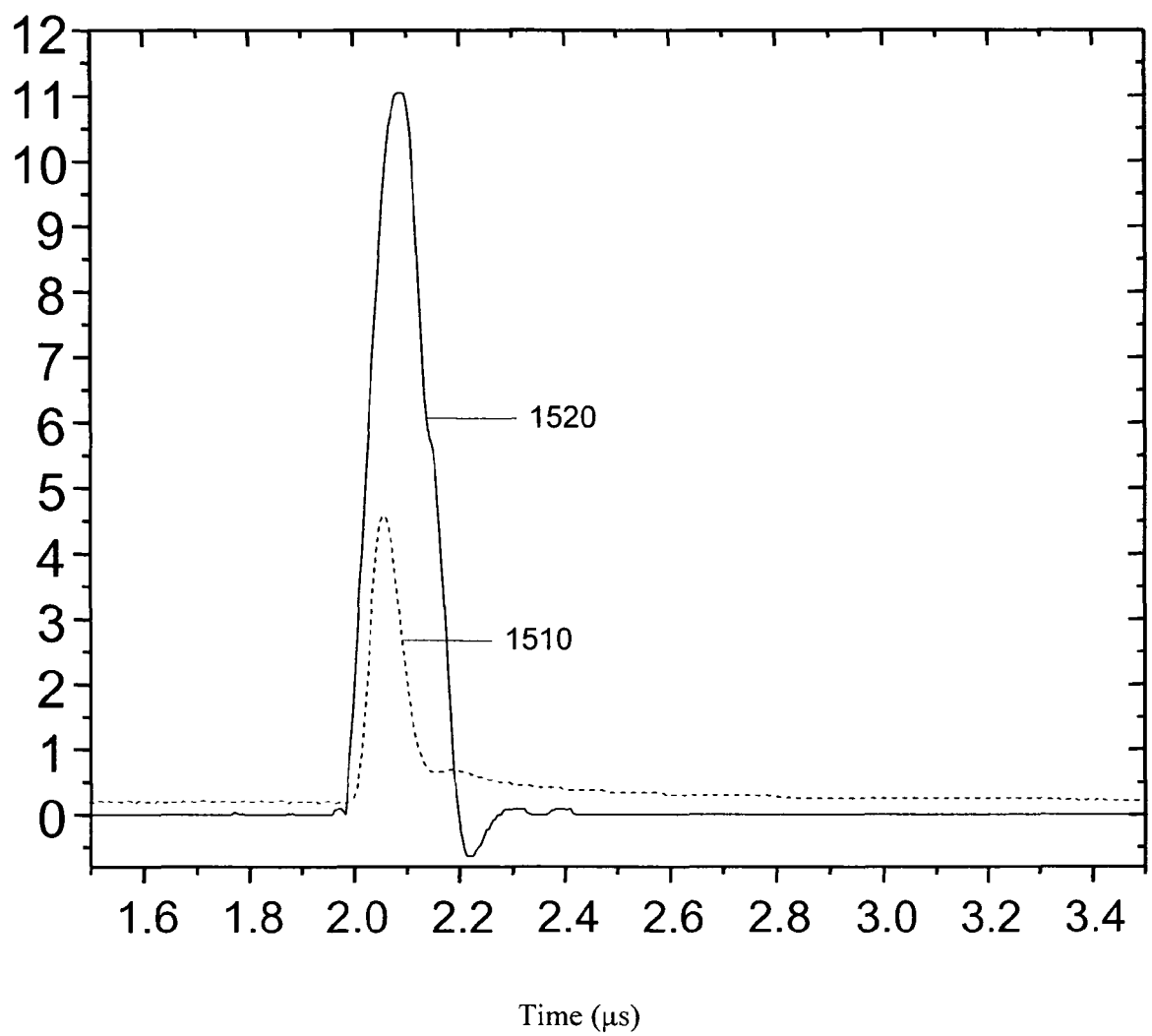
FIG. 15 shows a comparison of burst luminescence from an optically pumped organic light emitting device placed in an electric field for various pump sources.

The luminescence of an optically pumped organic emitting device disposed in an electric field was compared to a device with the same geometry and configuration pumped by a laser pulse. FIG. 15 shows observed emissions for both devices. The luminescence flash from the device 1510 is shown for an applied field of 1.4 MV/cm for a holding time of 5 ms. The emission for a device with the same configuration and geometry pumped by a 337 nm, 9 μJ/cm² laser pulse 1520 is also shown. Doped, small-molecule organic semiconductor lasers typically have thresholds on the order of 1 μJ/cm².

While the present invention is described with respect to particular examples and preferred embodiments, it is understood that the present invention is not limited to these examples and embodiments. The present invention as claimed therefore includes variations from the particular examples and preferred embodiments described herein, as will be apparent to one of skill in the art.

What is claimed is:
1. A device comprising:
a substrate;
a pumped emissive device; and
an optical pump;

wherein the pumped emissive device comprises in order:

a first electrode;

a first insulating layer;

an organic light emitting layer;

a second insulating layer; and a second electrode;

wherein when an adjustable electric field is applied across the first and second electrodes, the first and second insulating layers block electrical current through the organic light emitting layer.

2. The device of claim 1, wherein the organic light emitting layer comprises a first organic material doped with a second organic material.

3. The device of claim 2, wherein the organic light emitting layer comprises CBP doped with C6.

4. The device of claim 1, wherein the first and second insulating layers comprise a polymer.

5. The device of claim 1, wherein the first and second insulating layers are comprised of teflon.

6. The device of claim 1, wherein the optical pump provides energy to the organic light emitting layer at a linear rate.

7. The device of claim 1, wherein the optical pump comprises an OLED.

8. The device of claim 1, wherein the first and second insulating layers are thin enough to allow a desired number of charge carriers to tunnel through the insulating layers.

9. The device of claim 1, comprising in order the pumped emissive device, the substrate and the optical pump.

10. The device of claim 1, comprising in order the pumped emissive device, the optical pump, and the substrate.

* * * * *